United States Patent
Iwami

(10) Patent No.: US 10,346,965 B2
(45) Date of Patent: Jul. 9, 2019

(54) CONDUCTIVE FILM, DISPLAY DEVICE HAVING THE SAME, AND METHOD OF EVALUATING CONDUCTIVE FILM

(71) Applicant: FUJIFILM Corporation, Tokyo (JP)

(72) Inventor: Kazuchika Iwami, Ashigara-kami-gun (JP)

(73) Assignee: FUJIFILM Corporation, Minato-Ku, Tokyo (JP)

( * ) Notice: Subject to any disclaimer, the term of this patent is extended or adjusted under 35 U.S.C. 154(b) by 270 days.

(21) Appl. No.: 15/487,741

(22) Filed: Apr. 14, 2017

(65) Prior Publication Data

US 2017/0243342 A1 Aug. 24, 2017

Related U.S. Application Data

(63) Continuation of application No. PCT/JP2015/078976, filed on Oct. 14, 2015.

(30) Foreign Application Priority Data

Oct. 15, 2014 (JP) .................................. 2014-210751
Mar. 31, 2015 (JP) .................................. 2015-074618

(51) Int. Cl.
*G06T 7/00* (2017.01)
*G06F 3/044* (2006.01)
(Continued)

(52) U.S. Cl.
CPC ............ *G06T 7/0004* (2013.01); *G06F 3/044* (2013.01); *G06K 9/4661* (2013.01); *G06T 7/90* (2017.01);
(Continued)

(58) Field of Classification Search
None
See application file for complete search history.

(56) References Cited

U.S. PATENT DOCUMENTS

| 2011/0102361 A1* | 5/2011 | Philipp ............... G06F 3/044 345/174 |
| 2014/0055380 A1* | 2/2014 | Han .................... G06F 3/041 345/173 |
| 2015/0342034 A1 | 11/2015 | Iwami |

FOREIGN PATENT DOCUMENTS

| JP | 2014-041589 A | 3/2014 |
| WO | 2014/123009 A1 | 8/2014 |

OTHER PUBLICATIONS

International Preliminary Report on Patentability with translation of Written Opinion dated Apr. 27, 2017, issued by the International Searching Authority in application No. PCT/JP2015/078976.
(Continued)

*Primary Examiner* — Christopher J Kohlman
(74) *Attorney, Agent, or Firm* — Sughrue Mion, PLLC

(57) ABSTRACT

A conductive film has a polygonal wiring pattern which allows an indicator of evaluation of noises to be equal to or less than an evaluation threshold value. Here, from at least one point of view, in frequencies and intensities of noises each calculated for each color from first and second peak frequencies and first and second peak intensities of 2DFFT spectra of transmittance image data of a combined wiring pattern including a random mesh pattern of a plurality of thin metal lines of a wiring portion and luminance image data of a pixel array pattern of each color at the time of lighting on for each single color, the indicator of evaluation of noise is calculated from evaluation values of noises of the respective colors obtained by applying human visual response characteristics in accordance with an observation distance to intensities of the noises equal to or greater than a first intensity threshold value among intensities of the noises at frequencies of noises equal to or less than a frequency threshold value defined by a display resolution of a display unit.

30 Claims, 14 Drawing Sheets

(51) Int. Cl.
*G06T 7/90* (2017.01)
*G06K 9/46* (2006.01)
*H04N 9/083* (2006.01)
*H04N 9/73* (2006.01)
*H05K 9/00* (2006.01)

(52) U.S. Cl.
CPC ............ *H04N 9/083* (2013.01); *H04N 9/735* (2013.01); *H05K 9/0096* (2013.01); *G06F 2203/04103* (2013.01); *G06F 2203/04111* (2013.01); *G06F 2203/04112* (2013.01); *G06T 2207/10024* (2013.01); *G06T 2207/10056* (2013.01)

(56) References Cited

OTHER PUBLICATIONS

Written Opinion of the International Searching Authority of PCT/JP2015/078976 dated Jan. 12, 2016.
International Search Report of PCT/JP2015/078976 dated Jan. 12, 2016.
Communication dated Sep. 21, 2017, from European Patent Office in counterpart application No. 15851364.8.

* cited by examiner

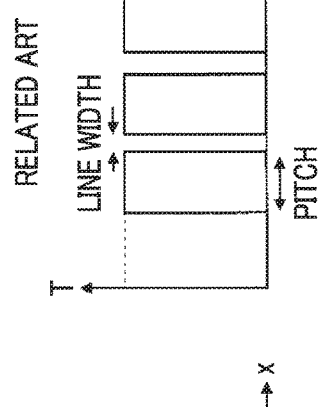
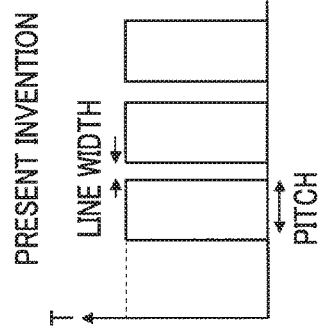
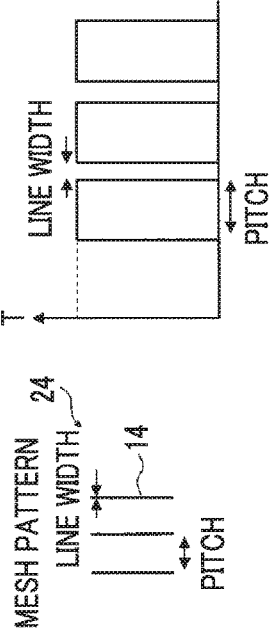
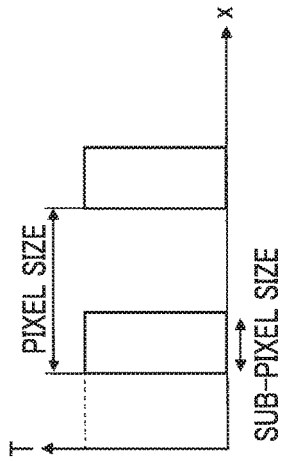
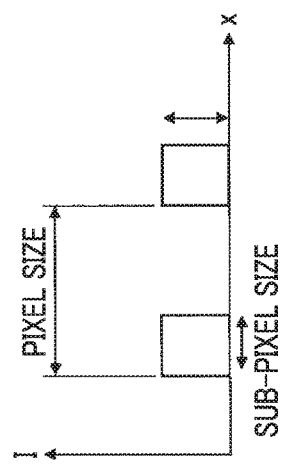
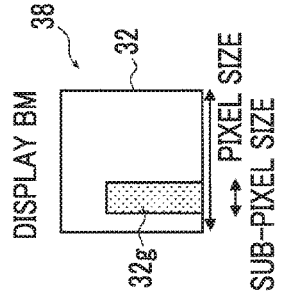

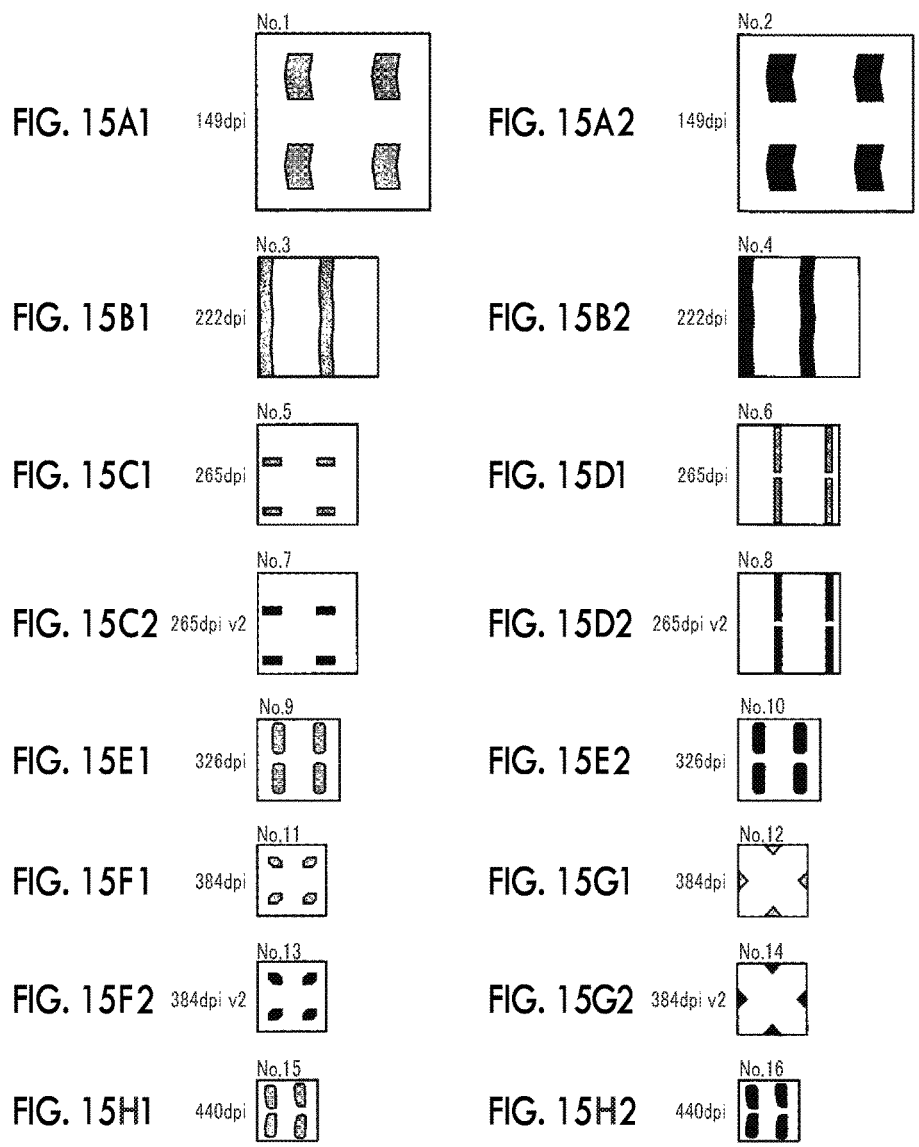

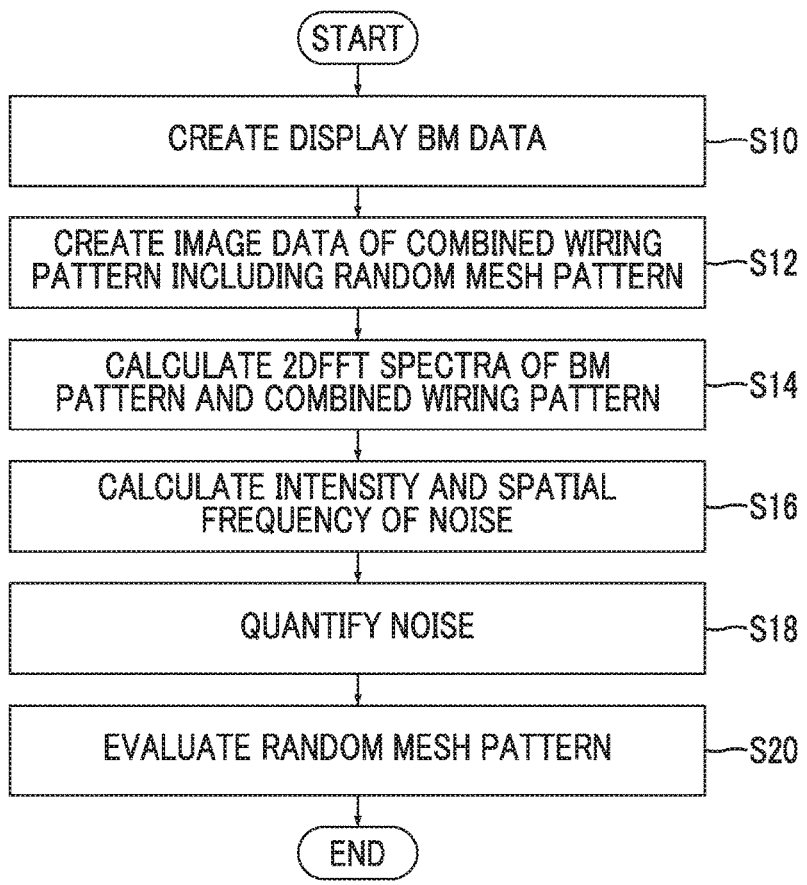

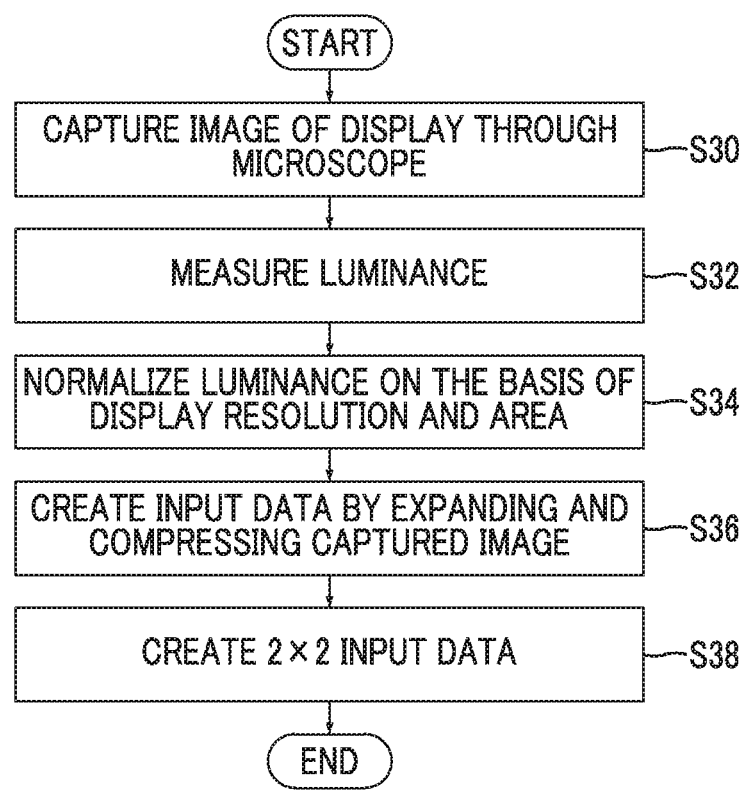

CAPTURED IMAGE

INPUT DATA

CONDUCTIVE FILM, DISPLAY DEVICE HAVING THE SAME, AND METHOD OF EVALUATING CONDUCTIVE FILM

CROSS-REFERENCE TO RELATED APPLICATIONS

This application is a Continuation of PCT International Application No. PCT/JP2015/078976 filed on Oct. 14, 2015, which claims priority under 35 U.S.C. §119(a) to Japanese Patent Application No. 2014-210751 filed on Oct. 15, 2014 and Japanese Patent Application No. 2015-074618 filed on Mar. 31, 2015. Each of the above applications is hereby expressly incorporated by reference, in its entirety, into the present application.

BACKGROUND OF THE INVENTION

1. Field of the Invention

The present invention relates to a conductive film, a display device having the same, and a method of evaluating the conductive film. Specifically, the invention relates to a conductive film having a mesh-shaped wiring pattern that has excellent visibility by suppressing noise which is caused by interference between the conductive film and a display device, a method of evaluating the conductive film, and a display device thereof. In particular, the present invention relates to a conductive film that has a mesh-shaped wiring pattern capable of providing image quality which is improved in terms of visibility of noise in accordance with an emission intensity of a display device even if the pattern overlaps with pixel array patterns of the display device having different emission intensities, a method of evaluating the conductive film, and a display device thereof.

2. Description of the Related Art

Examples of conductive films, each of which is provided on a display unit of a display device (hereinafter referred to as a display), include a conductive film for a touch panel having a conductive layer formed of thin metal lines which have a mesh-shaped wiring pattern (hereinafter referred to as a mesh pattern), a conductive film for an electromagnetic shield, and the like.

Regarding such a mesh pattern, since there is a problem that a noise caused by interference between a mesh pattern and a pixel array pattern (for example referred to as an array pattern of RGB color filters or a black matrix (hereinafter also referred to as a BM) pattern as a reverse pattern thereof) of a display may be visually perceived, various random mesh patterns due to which noise is not visually perceived or unlikely to be visually perceived have been proposed.

For example, JP2014-041589A discloses a touch panel capable of improving visibility by preventing a moiré phenomenon. In the touch panel, a virtual lattice is formed of the same polygons, predetermined points (seeds) are randomly generated inside the polygons, and thereafter the predetermined points and vertices of the polygons are connected, thereby irregularly forming a metal electrode pattern.

SUMMARY OF THE INVENTION

However, JP2014-041589A proposes that, in order to improve visibility, a metal electrode pattern, that is, a mesh pattern is made to be irregular.

Meanwhile, "noise", which is visually perceived due to overlapping between an irregular random mesh pattern and a BM pattern of a display, cannot be determined only on the basis of characteristics of a single mesh pattern. No matter how much the mesh pattern is constrained regardless of the display, if a pixel structure of the display to be superposed such as a BM pattern or a luminance changes, the visibly perceived noise changes.

Hence, in the mesh pattern of the touch panel disclosed in JP2014-041589A, there is a problem in that robust visibility using a random mesh pattern cannot be obtained. Consequently, it is necessary for a mesh pattern, which is excellent in visibility of noise, to be determined on the basis of a combination between the pattern and the display, but in JP2014-041589A, there is a problem in that this is not considered.

In order to solve the problems of the related arts, the present invention has an object to provide a conductive film that has a random (irregular) mesh-shaped wiring pattern (mesh pattern) capable of improving visibility by suppressing occurrence of noise which is visually perceived in the combination between the pattern and the display unit (display), a display device having the same, and a method of evaluating the pattern of the conductive film.

In particular, the present invention has an object to provide a conductive film, a display device having the same, and a method of evaluating the conductive film. The conductive film has a random mesh pattern capable of suppressing occurrence of noise, which greatly disturbs image quality, in accordance with the intensity of the display regardless of an observation distance and greatly improving visibility, even in a case where the pattern overlaps with the pixel array (BM) pattern of a display having a different emission intensity (luminance).

In order to achieve the above-mentioned objects, according to a first aspect of the present invention, a conductive film is provided on a display unit of a display device. The conductive film comprises: a transparent substrate; and two wiring portions that are formed on both sides or a single side of the transparent substrate. At least one wiring portion of the two wiring portions has a plurality of thin metal lines. The plurality of thin metal lines has a polygonal wiring pattern formed in a mesh shape such that a plurality of polygonal opening portions is arranged on the wiring portion. The plurality of thin metal lines of at least one wiring portion of the two wiring portions forms an irregular wiring pattern which is made to be irregular by making the plurality of opening portions have different opening shapes. In the display unit, pixels, which include a plurality of sub-pixels emitting light with a plurality of colors that are at least three colors different from each other, are arranged in pixel array patterns. The conductive film is provided on the display unit such that a combined wiring pattern of the two wiring portions including at least one irregular wiring pattern overlaps with the pixel array pattern of the display unit. From at least one point of view, the irregular wiring pattern is a polygonal wiring pattern formed such that an indicator of evaluation of noises is equal to or less than an evaluation threshold value, where in frequencies and intensities of the noises of respective colors of a plurality of colors calculated from a first peak frequency and a first peak intensity of a plurality of first spectrum peaks of two-dimensional Fourier spectra of transmittance image data of the combined wiring pattern and a second peak frequency and a second peak intensity of a plurality of second spectrum peaks of two-dimensional Fourier spectra of luminance image data of the pixel array patterns of the respective colors when light beams with the plurality of colors are respectively emitted, the indicator of evaluation is calculated from evaluation values of the noises of the respective colors obtained by applying human visual response characteristics in accordance with an observation distance to intensities of the noises equal to or greater than a first intensity threshold value among intensities of the noises at frequencies of the noises equal to or less than a frequency threshold value defined on the basis of a display resolution of the display unit.

Further, in order to achieve the object, according to a second aspect of the present invention, a display device comprises: a display unit in which pixels, which include a plurality of sub-pixels emitting light with a plurality of colors that are different from each other, are arranged in pixel array patterns which are repeated in a certain direction and a direction perpendicular to the certain direction; and the conductive film according to the first aspect of the present invention, the conductive film being provided on the display unit.

Furthermore, in order to achieve the above-mentioned objects, according to a third aspect of the present invention, there is provided a method of evaluating a conductive film that is provided on a display unit of a display device and has two wiring portions which are formed on both sides or a single side of the transparent substrate. The method comprises: providing a plurality of thin metal lines on at least one wiring portion of the two wiring portions; causing the plurality of thin metal lines to have a polygonal wiring pattern formed in a mesh shape such that a plurality of polygonal opening portions is arranged on the wiring portion; causing the plurality of thin metal lines of at least one wiring portion of the two wiring portions to form an irregular wiring pattern which is made to be irregular by making the plurality of opening portions have different opening shapes; arranging pixels, which include a plurality of sub-pixels emitting light with a plurality of colors that are at least three colors different from each other, in pixel array patterns, in the display unit; providing the conductive film on the display unit such that a combined wiring pattern of the two wiring portions including at least one irregular wiring pattern overlaps with the pixel array pattern of the display unit; acquiring transmittance image data of the combined wiring pattern and luminance image data of the pixel array patterns of respective colors of the plurality of colors of the display unit when light beams with the plurality of colors are respectively emitted, from at least one point of view; calculating a first peak frequency and a first peak intensity of a plurality of first spectrum peaks of two-dimensional Fourier spectra of transmittance image data of the combined wiring pattern and a second peak frequency and a second peak intensity of a plurality of second spectrum peaks of two-dimensional Fourier spectra of luminance image data of the pixel array patterns of the respective colors of the plurality of colors, for each color, by performing two-dimensional Fourier transform on the transmittance image data of the combined wiring pattern and the luminance image data of the pixel array pattern; calculating frequencies and intensities of noises of the respective colors of the plurality of colors from the first peak frequency and the first peak intensity of the combined wiring pattern and the second peak frequency and the second peak intensity of the pixel array patterns of the respective plurality of colors calculated in the above-mentioned manner; selecting noises having frequencies equal to or less than a frequency threshold value and intensities equal to or greater than a first intensity threshold value defined on the basis of a display resolution of the display unit, among the frequencies and intensities of the noises of the respective colors calculated in the above-mentioned manner; acquiring evaluation values of noises of the respective colors by applying human visual response characteristics in accordance with an observation distance to the intensities of noises at respective frequencies of noises of the respective colors selected in the above-mentioned manner; calculating an indicator of evaluation of the noises from the evaluation values of the noises of the respective colors acquired in the above-mentioned manner; and evaluating the conductive film that has a polygonal wiring pattern which allows the indicator of evaluation of the noises calculated in the above-mentioned manner to be equal to or less than a predetermined value.

In any one of the first to third aspects, it is preferable that the opening portions have two or more types of different opening shapes and polygonal shapes having two or more types of different numbers of vertices of the opening shapes. Each opening portion may be formed in a Voronoi polygonal shape or a Delaunay triangular shape based on seed points randomly arranged on a single planar region.

Alternatively, it is preferable that the irregular wiring pattern of the thin metal lines is a wiring pattern of thin lines formed of random line segments that are obtained by performing thinning processing on boundary regions between polygonal images which are obtained by patterning polygons of which centroids are seed points randomly arranged in a single planar region. In addition, it is preferable that shapes of the opening portions are deformed by performing the thinning processing on the polygons of the polygonal images, and includes two or more different opening shapes surrounded by the thin lines formed of the random line segments.

It is preferable that the evaluation threshold value is −2.80.

It is preferable that the luminance image data of the pixel array patterns of the respective colors is normalized luminance data that is obtained by normalizing the luminance image data obtained by converting captured image data of the colors, which is obtained by capturing images of the pixel array patterns of the respective colors displayed on a display screen of the display unit, into luminance values, when the light beams with the plurality of colors are separately emitted.

It is preferable that images of the pixel array patterns of the respective colors displayed on the display screen of the display unit are displayed on the display unit when the light beams with the plurality of colors are separately emitted at a maximum intensity which is settable for each color.

It is preferable that when the plurality of colors is three colors such as red, green, and blue, the captured image data of the images of the pixel array patterns of the respective colors such as red, green, and blue is image data that is obtained through imaging performed through white balance adjustment based on a white color of a Macbeth chart.

It is preferable that the luminance image data of the images of the pixel array patterns of the respective colors of the plurality of colors is obtained by giving the luminance data in which a measured luminance value is normalized through a product between a resolution of the display unit and an area having a value of a mask image, where the mask image is created from the captured image data which is obtained by capturing the image of the pixel array pattern of a current color displayed on the display screen of the display unit through a microscope, when the light beams of the respective colors of the plurality of colors are separately emitted in the display unit, and the luminance image data is obtained by normalizing a reference luminance of the display unit of the display device to 1.0.

Further, it is preferable that, when the plurality of colors is three colors such as red, green, and blue, the measured luminance value is a luminance value which is obtained from spectrum data of each color of red, green, and blue by separately performing display for each color of red, green, and blue and performing measurement through a spectrometer, and the mask image is an image that is obtained by binarizing the captured image data which is obtained through imaging of the microscope.

It is preferable that the two wiring portions are respectively formed on both side surfaces of the transparent substrate.

Alternatively, it is preferable that the conductive film further comprises a second transparent substrate that is different from a first transparent substrate when the transparent substrate is defined as the first transparent substrate, one wiring portion of the two wiring portions is formed on one surface of the first transparent substrate, and the other wiring portion of the two wiring portions is formed on one surface of the second transparent substrate, on the other surface side of the first transparent substrate.

Alternatively, it is preferable that the two wiring portions are respectively formed with insulation layers interposed therebetween on single sides of the transparent substrates.

It is preferable that all the plurality of thin metal lines of the two wiring portions constitutes the irregular wiring pattern.

Alternatively, it is preferable that the plurality of thin metal lines of one wiring portion of the two wiring portions constitutes the irregular wiring pattern, and the plurality of thin metal lines of the other wiring portion constitutes a regular polygonal wiring pattern.

Alternatively, it is preferable that the plurality of thin metal lines of one wiring portion of the two wiring portions constitutes the irregular wiring pattern, the other wiring portion is made of indium tin oxide, and the combined wiring pattern is the irregular wiring pattern.

Further, it is preferable that at least one wiring portion of the two wiring portions includes an electrode portion and a non-electrode portion, the plurality of thin metal lines of one of the electrode portion and the non-electrode portion constitutes the irregular wiring pattern, and the plurality of thin metal lines of the other of the electrode portion and the non-electrode portion constitutes a regular polygonal wiring pattern.

It is preferable that the plurality of first spectrum peaks has a peak intensity that is equal to or greater than a first threshold value which is selected from a plurality of spectrum peaks obtained by performing two-dimensional Fourier transform on the transmittance image data of the combined wiring pattern, and for each of the plurality of colors, the plurality of second spectrum peaks has a peak intensity that is equal to or greater than a second threshold value which is selected from a plurality of spectrum peaks obtained by performing two-dimensional Fourier transform on the luminance image data of the pixel array pattern.

Further, it is preferable that a frequency and an intensity of a noise corresponding to each color can be calculated through convolution operation of the first peak frequency and the first peak intensity and the second peak frequency and the second peak intensity corresponding to each color.

Furthermore, it is preferable that a frequency of a noise corresponding to each color is given as a difference between the first peak frequency and the second peak frequency corresponding to each color, and an intensity of the noise corresponding to each color is given as a product between the first peak intensity and the second peak intensity corresponding to each color.

It is preferable that an evaluation value of the noise is calculated by weighting a visual transfer function, which corresponds to the observation distance as the visual response characteristics, to the frequency and the intensity of the noise through convolution integration.

Further, it is preferable that the visual transfer function VTF is given by the following Expression (1).

$$\text{VTF} = 5.05 e^{-0.138k} (1 - e^{0.1k}) \tag{1}$$

$$k = \pi d u / 180$$

Here, k is a spatial frequency (cycle/deg) defined by a solid angle, u shown in the above-mentioned Expression (1) is a spatial frequency (cycle/mm) defined by a length, and d is defined by an observation distance (mm).

It is preferable that the indicator of evaluation of the noises is calculated using a largest evaluation value among the evaluation values of the plurality of the noises in which a frequency of one of the noises is weighted in accordance with the observation distance for each color.

Further, it is preferable that the indicator of evaluation of the noises is a largest sum among sums for the plurality of colors, the sums being obtained by adding the frequencies of all the noises to the largest evaluation value selected with respect to the frequency of one of the noises for each color.

Furthermore, it is preferable that the first intensity threshold value is −4.5 as a common logarithm. In addition, the frequency threshold value is a spatial frequency which is obtained from the resolution of the display unit, that is, a spatial frequency which corresponds to an inverse of a pitch of a single pixel.

It is preferable that assuming that a display pixel pitch of the display unit is Pd μm, the spatial frequency obtained from the resolution of the display unit is a highest frequency of the noises which is given as 1000/Pd cycle/mm.

Further, it is preferable that, from at least two points of view of front observation and oblique observation, the evaluation value is obtained for each color of the plurality of colors, and the indicator of evaluation is a largest evaluation value among evaluation values of respective colors obtained in the at least two points of view.

It is preferable that the pixel array patterns are black matrix patterns.

As described above, according to the present invention, it is possible to provide a conductive film that has a random mesh pattern capable of improving visibility by suppressing occurrence of noise which is visually perceived in the combination between the pattern and a display, a display device having the same, and a method of evaluating the pattern of the conductive film.

In particular, the random mesh pattern is capable of suppressing occurrence of noise, which greatly disturbs image quality, in accordance with the intensity of the display regardless of an observation distance and greatly improving visibility, even in a case where the pattern overlaps with the pixel array (BM) pattern of a display having a different emission intensity (luminance).

Further, according to the present invention, in addition to the above-mentioned effects, also in a design of a mesh pattern of the conductive film in a case where the opening shapes of the RGB sub-pixels of the display have frequencies and intensities (shapes and sizes) different from each other, it is possible to provide best image quality in combination with the pixel array pattern of a display having a different emission intensity.

BRIEF DESCRIPTION OF THE DRAWINGS

FIG. 11A is a schematic diagram illustrating an example of a structure of the random mesh pattern shown in FIG. 2, FIG. 11B is a schematic diagram illustrating an example of a structure of the pixel array pattern of the display unit shown in FIG. 9, FIG. 11C is an example of a graph of a transmittance (T) of the random mesh pattern in the present invention, FIG. 11D is an example of a graph of an intensity (I) of a representative sub-pixel of the display unit, and FIGS. 11E and 11F are examples of graphs of transmittances (T) of the representative sub-pixels of the random mesh pattern and the display unit in the related arts.

FIG. 12B is a partially enlarged view of the pixel array patterns of FIG. 12A.

FIGS. 15A1 to 15H2 are schematic diagrams illustrating examples of repetition units each having 2×2 pixels of representative sub-pixels of pixel array patterns of display units of which resolutions, shapes, and intensities are different.

FIG. 16 is a flowchart illustrating an example of a method of evaluating wiring on the conductive film according to the present invention.

FIG. 17 is a flowchart illustrating a specific example of a method of creating display BM data for a method of evaluating the conductive film of the present invention.

DESCRIPTION OF THE PREFERRED EMBODIMENTS

Figure 1:
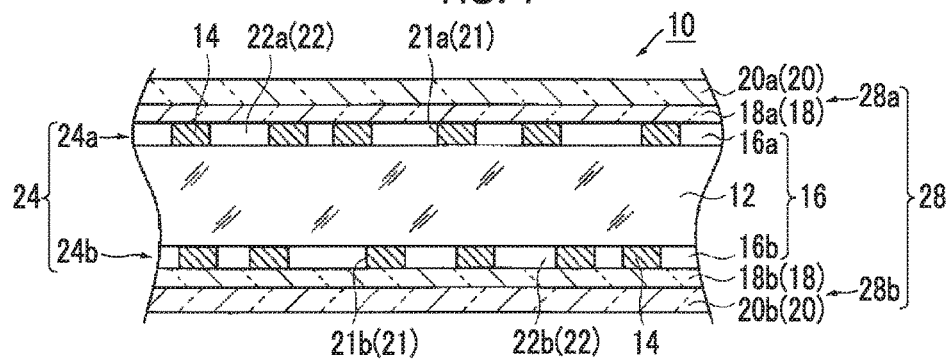
FIG. 1 is a partial cross-sectional view schematically illustrating an example of a conductive film according to a first embodiment of the present invention.

Hereinafter, a conductive film according to the present invention, a display device having the same, and a method of evaluating the conductive film will be described in detail with reference to most preferred embodiments shown in the accompanying drawings.

In the present invention, in order to suppress noise which is visually perceived due to overlapping between an irregular mesh-shaped random pattern (hereinafter referred to as a random mesh pattern) and a display pixel array (BM) pattern, a conductive film having a random mesh pattern for combination is provided on the display. Here, the random mesh pattern used in the present invention can be defined as an irregular pattern which has at least two types of different opening shapes where the at least two types of shapes have different numbers of vertices.

Meanwhile, in a combination in which noise visually perceived by the display and the random mesh pattern is quantified and the quantitative value is equal to or less than a threshold value, noise is not visually perceived. Accordingly, in the present invention, the random mesh pattern can be defined as described above, but it is necessary to quantify the BM pattern and the random mesh pattern of the display and quantify the visually perceived noise from quantitative values thereof.

Hence, in the present invention, first, the irregular mesh pattern, which has a plurality of different features, is assumed, and a transmittance image is created. Next, a convolution operation is performed on the fast Fourier transform (FFT) spectrum obtained from this transmittance image and the FFT spectrum obtained from the display. Here, the integrated value obtained by applying the visual transfer function to the obtained calculation result corresponds to the quantitative value of visibility of noise, and at this stage, the quantitative value of visibility of noise and the noise simulation image can be obtained. By evaluating the obtained image, visibility of noise allowable as visibility can be determined, and the conductive film of the present invention and the evaluation method thereof can be provided.

Hereinafter, the conductive film according to the present invention will be described as a representative example of a conductive film for a touch panel. The present invention is not limited to this. The conductive film may be any conductive film if it is a conductive film that is provided on the display unit with various light emission intensities of the display device and has wiring portions having random mesh-shaped wiring patterns (random mesh patterns) which are disposed on both sides of a transparent substrate or disposed on a single side thereof with an insulation layer interposed therebetween and which include at least one wiring pattern formed of cells (opening portions) having polygonal shapes which are made to be irregular. For example, as a matter of course, the present invention may be applied to a conductive film for shielding electromagnetic waves and the like.

The display unit of the display device on which the conductive film according to the present invention is superposed is not particularly limited. However, examples thereof include a liquid crystal display (LCD), a plasma display panel (PDP), organic light emitting (EL) diode (OLED) and an organic electro-luminescence display (OELD) using organic electro-luminescence (OEL), an inorganic electro-luminescence (EL) display, electronic paper, and the like.

As will be described in detail later, the display unit (hereinafter also referred to as a display) of the display device, on which the conductive film of the present invention is superposed, is not particularly limited if the display unit has the following characteristics. Pixels thereof, each of which includes a plurality of sub-pixels emitting light with a plurality of colors including at least mutually different three colors such as red, green, and blue, are arranged in the pixel array pattern (hereinafter also referred to as the BM pattern), and the luminances (brightnesses) of respective sub-pixels (color filters) based on the emission intensity (luminance) of the pixels are not particularly limited if the luminances can be taken into consideration in terms of evaluation of the visibility of noise due to the superposition of the conductive film. For example, in the same manner as that of the related arts, the display unit may have the following characteristics. The repetition cycles and the intensities (shapes, sizes), that is, the sub-pixel array pattern (the shapes, sizes, and cycles of the sub-pixels) of the sub-pixels (color filters) are all the same for a plurality of colors such as RGB, and the display unit has a BM pattern typified by G sub-pixels. Further, like the above-mentioned OELD, the display unit may be a display unit having a BM pattern that includes sub-pixel array patterns which are not the same for a plurality of colors, that is, which are different with respect to at least two colors.

In a manner similar to that of a high resolution smartphone, a tablet terminal, or the like, the display of the display device subjected to the present invention may be a display which has a high emission intensity. In a manner similar to that of a low resolution desktop PC, a television (TV), or the like, the display may be a display having a low emission intensity. In a manner similar to that of a medium resolution laptop or the like, the display may be a display having approximately a medium emission intensity.

Figure 2:
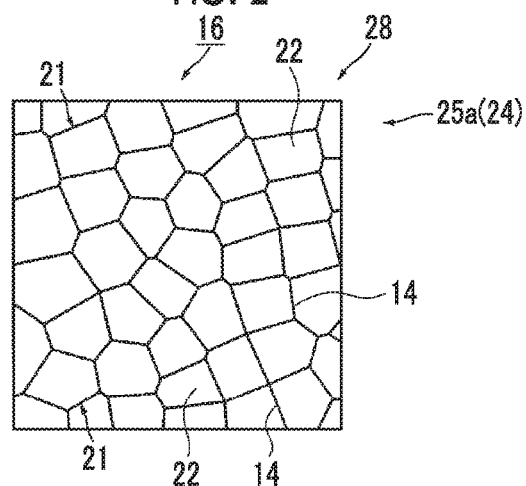
FIG. 2 is a plan view schematically illustrating an example of a random mesh-shaped wiring pattern, which is formed of Voronoi polygons, in the wiring portion of the conductive film shown in FIG. 1.

FIG. 1 is a partial cross-sectional view schematically illustrating an example of a conductive film according to a first embodiment of the present invention. FIG. 2 is a plan view schematically illustrating an example of an irregular wiring pattern of a wiring portion of the conductive film shown in FIG. 1.

As shown in the drawings, a conductive film 10 of the present embodiment is a conductive film that is provided on the display unit of the display device and that has a wiring pattern which is excellent in terms of suppression of occurrence of noise in the black matrix (BM) of the display unit, particularly, a wiring pattern which is optimized in terms of visibility of noise in the BM pattern when the wiring pattern overlaps with the BM pattern. The conductive film 10 has: a transparent substrate 12; a first wiring portion 16a that is formed on one surface (an upper surface in FIG. 1) of the transparent substrate 12, is formed of a plurality of thin lines made of metal (hereinafter referred to as thin metal lines) 14, and functions as a first electrode portion; a first protective layer 20a that is bonded to substantially the entire surface of the first wiring portion 16a through a first adhesive layer 18a so as to cover the thin metal lines 14; a second wiring portion (electrode) 16b that is formed on the other surface (a lower surface in FIG. 1) of the transparent substrate 12, is formed of a plurality of thin metal lines 14, and functions as a second electrode portion; and a second protective layer 20b that is bonded to substantially the entire surface of the second wiring portion 16b through a second adhesive layer 18b.

Hereinafter, the first wiring portion 16a and the second wiring portion 16b are collectively referred to as simply wiring portions 16, the first adhesive layer 18a and the second adhesive layer 18b are collectively referred to as simply adhesive layers 18, and the first protective layer 20a and the second protective layer 20b are collectively referred to as simply protective layers 20.

The transparent substrate 12 is formed of a material having an insulation property and having a high light-permeability, and examples thereof include a resin, glass, and silicon. Examples of the resin include polyethylene terephthalate (PET), polymethyl methacrylate (PMMA), polypropylene (PP), polystyrene (PS), and the like.

The thin metal lines 14 are not particularly limited as long as they are formed as wavy lines and thin lines made of metal having high conductivity, and include thin lines made of a line material such as gold (Au), silver (Ag) or copper (Cu). While it is more preferable indeed in terms of visibility if the thin metal lines 14 have a smaller line width, the line width has only to be equal to or less than 30 µm, for instance. For application to a touch panel, the line width of the thin metal lines 14 is preferably equal to or greater than 0.1 µm and equal to or less than 15 µm, more preferably equal to or greater than 1 µm and equal to or less than 9 µm, and still more preferably equal to or greater than 2 µm and equal to or less than 7 µm.

Each wiring portion 16 (16a, 16b) has a plurality of wavy thin metal lines 14 having the wiring pattern 24 (24a, 24b) which is formed of mesh wires 21 (21a, 21b) arranged in a mesh shape. Specifically, as shown in FIG. 2, the wiring pattern 24 (24a, 24b) is a mesh pattern in which opening portions (cells) 22 (22a, 22b) are arranged in a predetermined random shape such as a random polygonal shape formed by intersecting the plurality of thin metal lines 14 with each other.

As shown in FIG. 2, each wiring portion 16 (16a and 16b) is formed of the thin metal lines 14 and a wiring layer 28 (28a and 28b) that has the wiring pattern 24 (24a and 24b) formed in a random mesh shape by the opening portions (cells) 22 (22a and 22b) between the thin metal lines 14 adjacent to each other. Each of the wiring patterns 24a and 24b is a wiring pattern that is made to be irregular by making the opening portions formed of the plurality of thin metal lines in random polygonal shapes, that is, a random mesh pattern 25a. The random mesh pattern 25a may be any random mesh pattern if the opening portions 22 formed of the thin metal lines 14 have two or more types of different opening shapes and two or more types of different numbers of vertices of the opening shapes.

In the example shown in FIG. 1, the wiring patterns 24 have, as the wiring patterns 24a and 24b, random mesh patterns 25a, as shown in FIG. 2.

Figure 3:
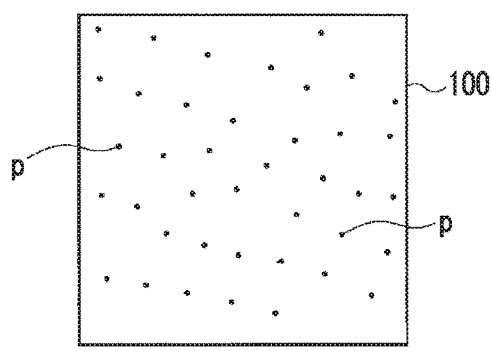
FIG. 3 is a schematic explanatory view of an example of a dot cut-out image showing seed points (dots) generated at arbitrary intervals in a single planar region in order to generate the Voronoi polygons forming the random mesh pattern shown in FIG. 2.

Here, the random mesh pattern 25a, which is an irregular wiring pattern shown in FIG. 2, has a wiring shape that has the opening portions 22 formed of Voronoi polygons depending on a Voronoi diagram (Voronoi division method) on the basis of a plurality of seed points p, which are present at a plurality of positions at arbitrary intervals in a single planar region 100 as shown in FIG. 3.

FIG. 3 shows a dot cut-out image in which dots are generated as a plurality of seed points p at a plurality of positions randomly selected with arbitrary intervals in a single planar region 100 in order to generate the Voronoi polygons forming the random mesh pattern shown in FIG. 2.

In the random mesh pattern 25a shown in FIG. 2, areas of a plurality of random polygonal shapes respectively surrounding the plurality of seed points p shown in FIG. 3, that is, areas of a plurality of Voronoi polygons are defined in accordance with the Voronoi diagram (Voronoi division method). Here, the areas of the plurality of Voronoi polygons divided by the Voronoi diagram are shown as a set of points closest to the seed points p. Here, as a distance function, the Euclid distance is used, but various functions may be used.

In the present invention, as the used random mesh pattern, a random mesh pattern (not shown in the drawing), which has a wiring shape having the opening portions 22 formed of Delaunay triangles determined in accordance with the Delaunay diagram (Delaunay triangulation method) on the basis of the plurality of seed points shown in FIG. 3, may be used. The Delaunay triangulation method is a method of defining the triangular areas by connecting the adjacent seed points among the plurality of seed points p. Thereby, for example, it is possible to define each of the areas of the plurality of Delaunay triangles of which the vertices are some of the plurality of seed points.

Further, the random mesh pattern used in the present invention is not limited to a random mesh pattern in which the shapes of the opening portions (cells) are Voronoi polygons, Delaunay triangles or the like, and any pattern may be used if the pattern is a random mesh pattern.

For example, the pattern may be a random mesh pattern which is formed by randomizing the regular typical pattern of regular polygons such as rhomboids with a degree of randomicity equal to or less than several %, for example, 10%. It should be noted that such a random mesh pattern does not include a pattern in which only pitches of a regular typical pattern of regular polygons are randomized, and a pattern in which only angles thereof are randomized.

Figure 23:
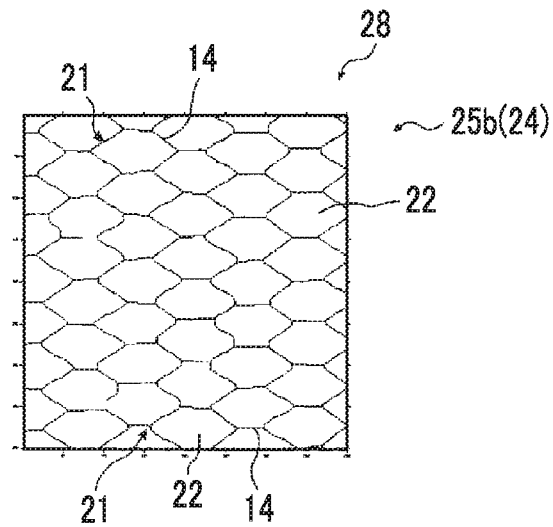
FIG. 23 is a plan view schematically illustrating another example of a random mesh-shaped wiring pattern of a wiring portion of the conductive film of the present invention.

As the random mesh pattern having such anisotropy, for example, a random mesh pattern as shown in FIG. 23 can be used.

The random mesh pattern shown in FIG. 23 is a random pattern having an intermediate directivity between a regular typical mesh pattern (hereinafter also referred to as a typical pattern) having a strong frequency peak intensity and a strong directivity and a random mesh pattern (hereinafter also referred to simply as a Voronoi random pattern) which is formed such that shapes of opening portions (cells) are Voronoi polygons, Delaunay triangles, or the like having a weak frequency peak intensity and a weak directivity.

Here, in the anisotropic random mesh pattern 25b shown in FIG. 23, a base figure of each opening portion 22 is a rhomboid, and opening centroids of the opening portions 22 vary by several %, for example, about 5%, preferably 10% to 15%, and more preferably 15% to 20% as an average value. The pattern can be formed in the following manner.

Figure 24A:
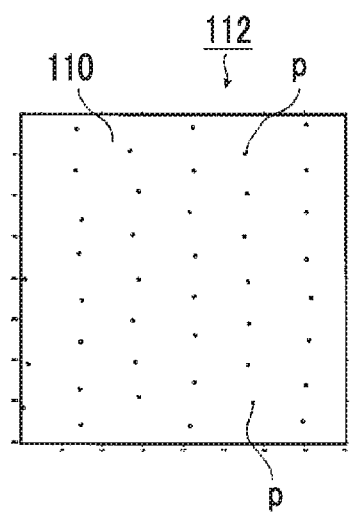
FIG. 24A is a schematic explanatory view of an example of a dot cut-out image showing seed points (dots) generated at arbitrary intervals in a single planar region in order to generate the polygons forming the random mesh pattern shown in FIG. 23.

First, as shown in FIG. 24A, a dot cut-out image 112 is generated. In the image, seed points (dots) p are arranged at a plurality of positions randomly selected at arbitrary intervals, for example, a plurality of positions at arbitrary intervals using a random number or the like, centroids of closed spaces such as rhomboids in a single planar region 110. It should be noted that dots are regularly arranged in the planar region 110 in advance, and the intervals between the dots are shifted in arbitrary directions of 360 degrees by using a standard deviation or the like, whereby the seed points p may be arranged.

Figure 24B:
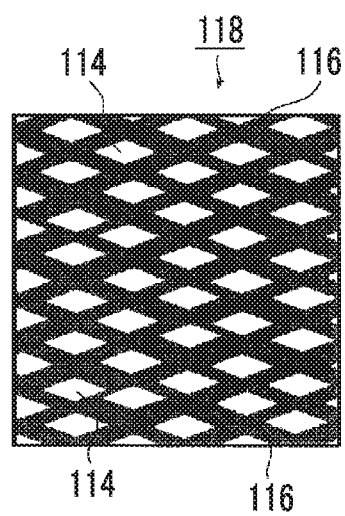
FIG. 24B is a schematic explanatory view of an example of a rhomboid pattern image having a pattern of rhomboids at positions of dots on the dot cut-out image shown in FIG. 24A.

Next, as shown in FIG. 24B, rhomboid patterns 114 are formed as the opening portions 22 arranged around the positions of the seed points p shown in FIG. 24A in the planar region 110 such that the adjacent rhomboid patterns 114 are spaced apart from each other and a boundary region 116 is interposed therebetween, thereby forming a rhomboid pattern image 118. In the example shown in the drawing, the rhomboid patterns 114 are formed around the seed points p, but the present invention is not limited to the rhomboids. The shape of each pattern may be a polygon including a triangle such as an equilateral triangle or an isosceles triangle, a quadrangle such as a square, a rectangle, or a parallelogram, a pentagon such as a regular pentagon, a hexagon such as a regular hexagon, and the like.

Next, in order to thin lines of the boundary region 116 of the rhomboid pattern image 118 shown in FIG. 24B, thinning processing, for example, thinning processing of Matlab produced by Mathworks Corp. is performed.

Here, the thinning processing is performed as follows. The boundary region 116 is reduced in size by removing pixels of the edge portions of the boundary region 116, and the rhomboid patterns 114 are expanded by removing pixels of the edge portions of the rhomboid patterns 114. These processes are repeated, thereby forming thin lines with the same line widths.

In such a manner, the random mesh pattern 25b shown in FIG. 23 can be formed.

The thin metal lines 14 having such a shape can be easily formed by a known method such as etching using a metal layer such as silver.

Figure 25A:
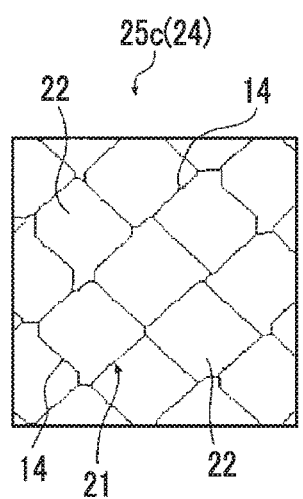
FIGS. 25A, 25B, and 25C are respectively plan views schematically illustrating other examples of a random mesh-shaped wiring pattern of a wiring portion of the conductive film of the present invention.
Figure 25B:
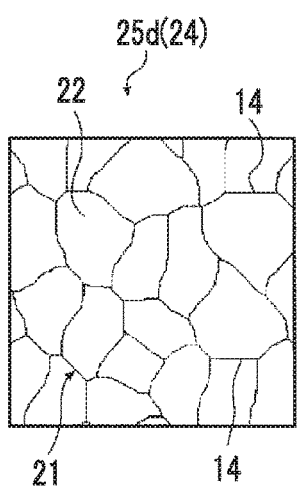
Figure 25C:
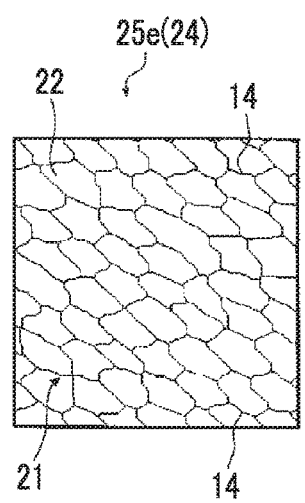

As the random mesh pattern having anisotropy, in addition to the random mesh pattern 25b shown in FIG. 23 in which the base figure is the rhomboid patterns 114 shown in FIG. 24B, for example, the following may be used: a random mesh pattern 25c shown in FIG. 25A in which the base figure is a rhomboid different from the rhomboid patterns 114 shown in FIG. 24B; a random mesh pattern 25d shown in FIG. 25B in which the base figure is a hexagon; and a random mesh pattern 25e shown in FIG. 25C in which the base figure is a parallelogram.

Hereinafter, the random mesh pattern 25a shown in FIG. 2 will be described as a representative example, but it is apparent that the random mesh patterns 25b, 25c, 25d, and 25e shown in FIGS. 23, 25A, 25B, and 25C can be applied in the same manner.

Although details will be described later, when the conductive film 10 of the present invention has the combined wiring pattern 24 of the upper and lower wiring patterns 24a and 24b, the conductive film 10 of the present invention has a random mesh pattern optimized in terms of visibility of noise at a predetermined luminance (luminance image data) of the BM pattern of the display unit. In the present invention, the rhomboid mesh pattern, which is optimized in terms of visibility of noise with respect to the BM pattern at the predetermined luminance, is defined as a single wiring pattern or a group of two or more wiring patterns making noise not perceived by human visual sensation with respect to the BM pattern at the predetermined luminance when the rhomboid wiring pattern is formed as the combined wiring pattern 24. It should be noted that, in the present invention, the visibility of noise is defined by a degree at which noise is not visually perceived.

Accordingly, the random mesh pattern 25a shown in FIG. 2 is a random mesh pattern that is optimized in terms of visibility of noise at the predetermined luminance (luminance image data) of the BM pattern of the display unit when formed as a combined wiring pattern 24, and is a random mesh pattern which allows an indicator of evaluation of noise to be equal to or less than a predetermined evaluation threshold value. The indicator is calculated from synthetic image data of the combined wiring pattern 24, in which upper and lower wiring patterns 24a and 24b overlap with each other, as transmittance image data of the random mesh pattern 25a and luminance image data of the BM pattern of each color obtained when light beams with the plurality of colors of the display are respectively emitted. The random mesh pattern 25a itself is a random mesh pattern which is superimposed on a display screen of the display with a predetermined emission intensity, is able to sufficiently prevent noise from occurring and to improve visibility, and is optimized in terms of visibility of noise with respect to the BM pattern at the predetermined luminance of the display unit.

In the random mesh pattern 25a optimized in such a manner, disconnections (brakes) may be inserted into sides (mesh wires 21) of the thin metal lines 14 constituting the opening portions 22. As the shape of the mesh-shaped wiring pattern having such breaks, it is possible to employ a shape of a mesh-shaped wiring pattern of a conductive film described in JP2012-276175 relating to the present application of the applicant.

Figure 4:
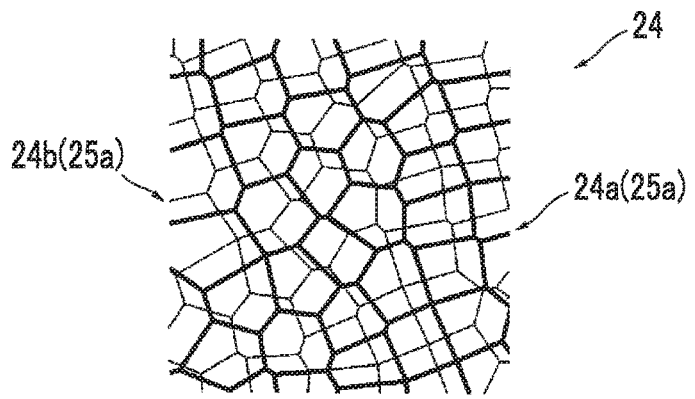
FIG. 4 is a plan view schematically illustrating an example of a combined wiring pattern which is combined by overlapping the upper and lower wiring patterns of the wiring portions of the conductive film shown in FIG. 1.
Figure 5:
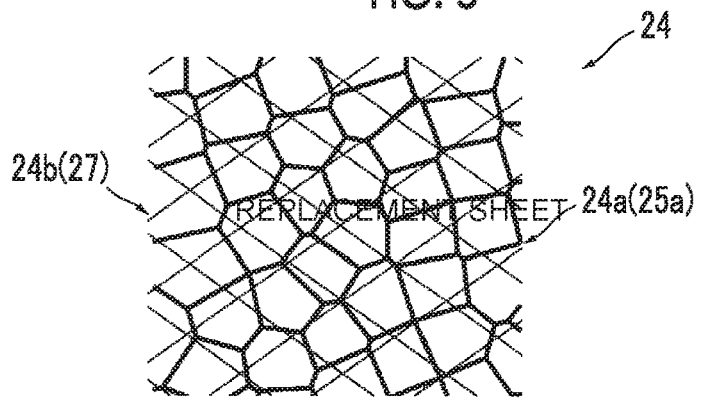
FIG. 5 is a plan view schematically illustrating an example of a combined wiring pattern which is combined by overlapping the upper and lower wiring patterns of the wiring portions of the conductive film according to another embodiment of the present invention.

In the conductive film 10 of the embodiment shown in FIG. 1, in FIG. 1, the plurality of thin metal lines 14 of the first wiring portion 16a on the upper side (viewing side) of the transparent substrate 12, and the plurality of thin metal lines 14 of the second wiring portion 16b on the lower side (display side), respectively have, as the wiring patterns 24a and 24b, the irregular random mesh pattern 25a shown in FIG. 2. As shown in FIG. 4, the combined wiring pattern 24, which is made to be irregular by overlapping the irregular wiring patterns 24a and 24b on the upper and lower sides, is formed. In FIG. 4 and FIG. 5 to be described later, in order to facilitate understanding, the plurality of thin metal lines 14 constituting the upper wiring pattern 24a is indicated by the heavy lines, and the plurality of thin metal lines 14 constituting the lower wiring pattern 24b is indicated by the thin lines. Here, it is needless to say that widths of the heavy lines and the thin lines may not be real line widths of the thin metal lines 14, may be equal thereto, and may be different therefrom.

That is, in the example shown in FIG. 1, the first and second wiring portions 16a and 16b each are formed of a plurality of thin metal lines having such the irregular random mesh pattern 25a shown in FIG. 2. However, the present invention is not limited to this, and at least a part of either one wiring portion 16 thereof may have a plurality of thin metal lines having the irregular random mesh pattern 25a shown in FIG. 2.

As described above, the irregular (randomized) random mesh pattern 25a is formed of the entirety or a part of the thin metal lines of the wiring portion 16 (wiring portion 16a or 16b) on the upper or lower side of the conductive film, and the mesh-shaped wiring pattern, in which the wiring patterns of both wiring portions 16 overlaps and are combined, is randomized. As a result, it is possible to randomize the light transmitted through the mesh-shaped wiring pattern, and it is possible to improve visibility of noise which is caused by interference between the display and the wiring pattern.

For example, as shown in FIG. 5, the first and second wiring portions 16a and 16b each are formed of a plurality of thin metal lines having a different wiring pattern. In the example shown in FIG. 5, the first wiring portion 16a on the upper side of the transparent substrate 12 is formed of the plurality of thin metal lines 14 having the irregular random mesh pattern 25a shown in FIG. 2, and the second wiring portion 16b on the lower side of the transparent substrate 12 is formed of the plurality of thin metal lines 14 having the regular typical pattern 27 formed of rhomboid opening portions. On the contrary, the first wiring portion 16a may be formed of the plurality of thin metal lines 14 having the typical pattern 27, and the second wiring portion 16b may be formed of the plurality of thin metal lines 14 having the random mesh pattern 25a. In such a manner, the combined wiring pattern, in which the random mesh pattern 25a and the regular typical pattern 27 overlap with each other, can be made to be irregular.

Figure 6:
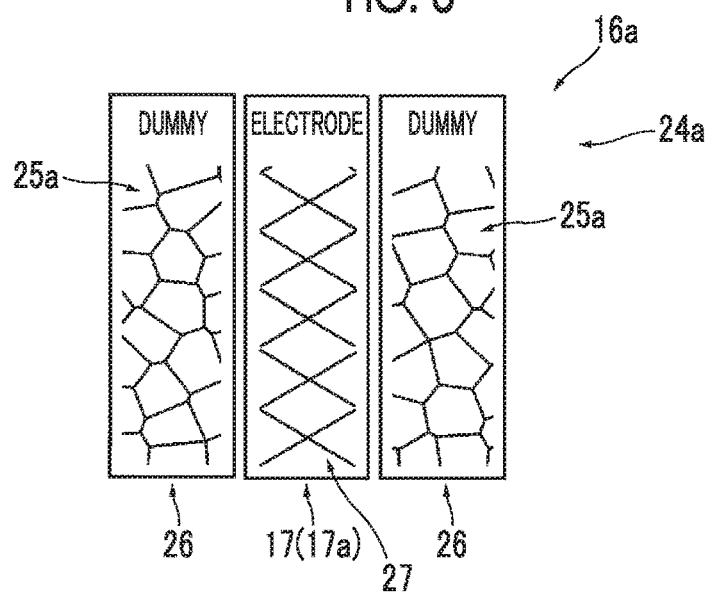
FIG. 6 is a plan view schematically illustrating an example of the upper wiring pattern of the wiring portion of the conductive film according to another embodiment of the present invention.

Alternatively, as shown in FIG. 6, the plurality of thin metal lines 14 of at least one of the first and second wiring portions 16a and 16b may be divided into dummy electrode portions (non-electrode portions) 26 and the electrode portion 17 constituting the wiring layer 28, by using the disconnections (brakes), as described above. Then, either one of the electrode portion 17 or the dummy electrode portion 26 may be formed of the plurality of thin metal lines 14 having the random mesh pattern 25a shown in FIG. 2, and the other one may be formed of the plurality of thin metal lines 14 having the regular typical pattern 27 (refer to FIG. 5). Such a configuration may be applied to the conductive film 11 of a second embodiment of the present invention shown in FIG. 7 to be described later. In such a manner, it is possible to make irregular a combined wiring pattern in which a combination between the random mesh pattern 25a and the regular typical pattern 27 overlaps with the random mesh pattern 25a or typical pattern 27 or a combined wiring pattern in which combinations between the random mesh pattern 25a and the typical pattern 27 overlap each other.

In FIG. 6, the first wiring portion 16a on the upper side of the transparent substrate 12 is divided into an electrode portion 17a and two dummy electrode portions 26 on the right and left sides thereof, by using disconnections (brakes).

The two dummy electrode portions 26 each are formed of the plurality of thin metal lines 14 having the random mesh pattern 25a shown in FIG. 2. The electrode portion 17a is formed of the plurality of thin metal lines 14 having the regular typical pattern 27. However, it is apparent that a configuration opposite to the above-mentioned configuration may be adopted.

In the examples shown in FIGS. 4, 5, and 6, the first wiring portion 16a and the second wiring portion 16b each are formed of the plurality of thin metal lines 14. However, the present invention is not limited to this, instead of the plurality of thin metal lines 14, one wiring portion may be formed of wires which are patterned by a transparent conductive layer such as ITO (Indium Tin Oxide (tin-doped indium oxide)).

For example, in the example shown in FIG. 5 and an example opposite thereto, wires patterned by ITO may be used instead of the plurality of thin metal lines 14 having one regular typical pattern 27 of the first wiring portion 16a and the second wiring portion 16b.

Further, as shown in FIG. 6, one of the first wiring portion 16a and the second wiring portion 16b may be divided into an electrode portion 17a and two dummy electrode portions 26 on the right and left sides thereof, by using disconnections (brakes), and one of the electrode portion 17a and the dummy electrode portions 26 may be formed of the plurality of thin metal lines 14 having a randomized wiring pattern. In this case, wires patterned by ITO may be used instead of the plurality of thin metal lines 14 constituting the other wiring portion.

A structure of the conductive film 11 of the second embodiment of the present invention shown in FIG. 7 will be described below.

As described above, the first protective layer 20a is bonded to the substantially entire surface of the wiring layer 28a formed of the first wiring portion 16a through the first adhesive layer 18a so as to cover the thin metal lines 14 of the first wiring portion 16a. Further, the second protective layer 20b is bonded to the substantially entire surface of the wiring layer 28b formed of the second wiring portion 16b through the second adhesive layer 18b so as to cover the thin metal lines 14 of the second wiring portion 16b.

Here, examples of materials of the adhesive layers 18 (the first adhesive layer 18a and the second adhesive layer 18b) include a wet lamination adhesive, a dry lamination adhesive, a hot melt adhesive, and the like. The material of the first adhesive layer 18a and the material of the second adhesive layer 18b may be the same or may be different.

The protective layers 20 (the first protective layer 20a and the second protective layer 20b) each are made of a high transmissive material including resin, glass, and silicon, similarly to the transparent substrate 12. The material of the first protective layer 20a and the material of the second protective layer 20b may be the same or may be different.

It is preferable that both a refractive index n1 of the first protective layer 20a and a refractive index n2 of the second protective layer 20b are values equal or approximate to a refractive index n0 of the transparent substrate 12. In this case, both the relative refractive index nr1 of the transparent substrate 12 with respect to the first protective layer 20a and the relative refractive index nr2 of the transparent substrate 12 with respect to the second protective layer 20b are values approximate to 1.

In this specification, the refractive index means a refractive index for the light at a wavelength of 589.3 nm (sodium D ray). For example, in regard to resins, the refractive index is defined by ISO 14782: 1999 (corresponding to JIS K 7105) that is an international standard. Further, the relative refractive index nr1 of the transparent substrate 12 with respect to the first protective layer 20a is defined as nr1=(n1/n0), and the relative refractive index nr2 of the transparent substrate 12 with respect to the second protective layer 20b is defined as nr2=(n2/n0).

Here, the relative refractive index nr1 and the relative refractive index nr2 are preferably in a range equal to or greater than 0.86 and equal to or less than 1.15, and more preferably in a range equal to or greater than 0.91 and equal to or less than 1.08.

By limiting the ranges of the relative refractive index nr1 and the relative refractive index nr2 as the above-mentioned range and controlling a member-to-member light transmittance between the transparent substrate 12 and the protective layers 20 (20a, 20b), visibility of noise can be further improved, and thus the conductive film can be improved.

In the conductive film 10 of the embodiment shown in FIG. 1, the wiring portions 16 (16a and 16b) on both the upper and lower sides of the transparent substrate 12 each are formed as an electrode portion having the plurality of thin metal lines 14. However, the present invention is not limited to this, and at least one of the first and second wiring portions 16a and 16b may be formed of an electrode portion and a non-electrode portion (dummy electrode portion).

Figure 7:
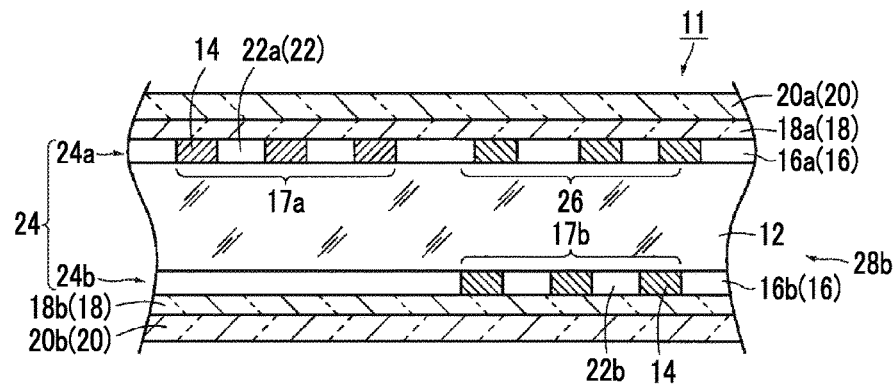
FIG. 7 is a schematic partial cross-sectional view of an example of a conductive film according to a second embodiment of the present invention.

FIG. 7 is a schematic partial cross-sectional view of an example of the conductive film according to the second embodiment of the present invention. The plan view of the wiring patterns of the conductive film according to the second embodiment shown in FIG. 7 is the same as the plan view of the wiring patterns shown in FIGS. 2, 4, and 5, and accordingly, will be omitted herein.

As shown in the drawing, the conductive film 11 according to the second embodiment has: the first wiring portion 16a that is formed of the first electrode portion 17a and the dummy electrode portion 26 which are formed on one surface (on the upper side in FIG. 7) of the transparent substrate 12; the second wiring portion 16b that is formed of the second electrode portion 17b which is formed on the other surface (on the lower side in FIG. 7) of the transparent substrate 12; the first protective layer 20a that is bonded to the substantially entire surface of the first wiring portion 16a, which is formed of the first electrode portion 17a and the dummy electrode portion 26, through the first adhesive layer 18a; and the second protective layer 20b that is boned to the substantially entire surface of the second wiring portion 16b, which is formed of the second electrode portion 17b, through the second adhesive layer 18b.

In the conductive film 11, the first electrode portion 17a and the dummy electrode portion 26 each are formed of the plurality of thin metal lines 14 and both thereof are formed as the wiring layer 28a on one surface (on the upper side in FIG. 7) of the transparent substrate 12, and the second electrode portion 17b is formed of the plurality of thin metal lines 14 and is formed as the wiring layer 28b on the other surface (on the lower side in FIG. 7) of the transparent substrate 12. Here, the dummy electrode portion 26 is formed on one surface (on the upper side in FIG. 7) of the transparent substrate 12 similarly to the first electrode portion 17a, and has the plurality of thin metal lines 14 similarly arranged at positions corresponding to the plurality of thin metal lines 14 of the second electrode portion 17b formed on the other surface (on the lower side in FIG. 7), as shown in the drawing.

The dummy electrode portion 26 is separated from the first electrode portion 17a by a predetermined distance, and is in the state of being electrically insulated from the first electrode portion 17a.

In the conductive film 11 according to the present embodiment, the dummy electrode portion 26 formed of the plurality of thin metal lines 14 corresponding to the plurality of thin metal lines 14 of the second electrode portion 17b formed on the other surface (on the lower side in FIG. 7) of the transparent substrate 12 is formed on one surface (on the upper side in FIG. 7) of the transparent substrate 12. Therefore, scattering due to the thin metal lines on the one surface (on the upper side in FIG. 7) of the transparent substrate 12 can be controlled, and it is thus possible to improve visibility of electrode.

Here, the first electrode portion 17a and the dummy electrode portion 26 of the wiring layer 28a have the wiring pattern 24a having a mesh shape which is formed by the thin metal lines 14 and opening portions 22. The second electrode portion 17b of the wiring layer 28b has a wiring pattern 24b having a mesh shape which is formed by the thin metal lines 14 and opening portions 22, similarly to the first electrode portion 17a. As described above, the transparent substrate 12 is formed of an insulating material, and the second electrode portion 17b is in the state of being electrically insulated from the first electrode portion 17a and the dummy electrode portion 26.

In addition, the first and second electrode portions 17a and 17b and the dummy electrode portion 26 each can be formed of the same material as the wiring portions 16 of the conductive film 10 shown in FIG. 1 in the same manner.

The first protective layer 20a is bonded to the substantially entire surface of the wiring layer 28a formed of the first electrode portion 17a and the dummy electrode portion 26 through the first adhesive layer 18a so as to cover the thin metal lines 14 of the first electrode portion 17a and the dummy electrode portion 26 of the first wiring portion 16a.

Further, the second protective layer 20b is bonded to the substantially entire surface of the wiring layer 28b formed of the second electrode portion 17b through the second adhesive layer 18b so as to cover the thin metal lines 14 of the second electrode portion 17b of the second wiring portion 16b.

It should be noted that the first and second adhesive layers 18a and 18b and the first and second protective layers 20a and 20b of the conductive film 11 shown in FIG. 7 are those of the conductive film 10 shown in FIG. 1, and a description thereof will be omitted.

In the conductive film 11 of the present embodiment, the second wiring portion 16b having the second electrode portion 17b does not have the dummy electrode portion. However, the present invention is not limited to this, and in the second wiring portion 16b, the dummy electrode portion, which is electrically insulated from the second electrode portion 17b at a predetermined interval away from the first electrode portion 17a and is formed of the thin metal lines 14, may be disposed at a position corresponding to the first electrode portion 17a of the first wiring portion 16a.

In the conductive film 11 of the present embodiment, the dummy electrode portion 26 is provided on the first wiring portion 16a, and such a dummy electrode portion is provided on the second wiring portion 16b. Thereby, the dummy electrode portions may be disposed to correspond to respective mesh wires of the first electrode portion 17a of the first wiring portion 16a and the second electrode portion 17b of the second wiring portion 16b. Therefore, scattering due to the thin metal lines on the one surface (on the upper or lower side in FIG. 7) of the transparent substrate 12 can be controlled, and it is thus possible to improve visibility of electrode.

In the conductive films 10 and 11 of the first and second embodiments shown in FIGS. 1 and 7, the wiring portions 16 (16a and 16b) are respectively formed on both upper and lower sides of the transparent substrate 12. However, the present invention is not limited to this, and in a manner similar to that of a conductive film 11A of a third embodiment of the present invention shown in FIG. 8, the following structure may be adopted: the wiring portion 16 formed of the plurality of thin metal lines 14 may be formed on one surface (the upper surface in FIG. 8) of the transparent substrate 12, and two conductive film elements, in which the protective layers 20 are bonded to substantially the entire surfaces of the wiring portions 16 through the adhesive layers 18 so as to cover the thin metal lines 14, overlap with each other.

Figure 8:
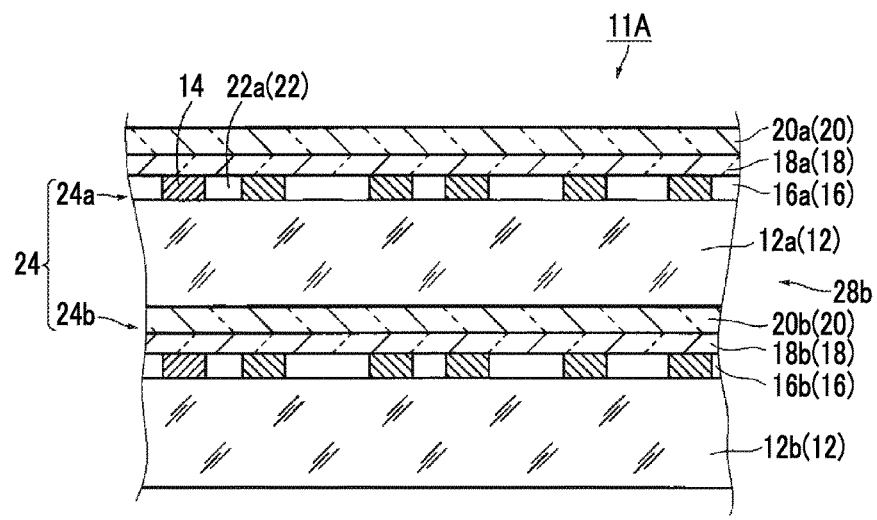
FIG. 8 is a schematic partial cross-sectional view of an example of a conductive film according to a third embodiment of the present invention.

The conductive film 11A of the third embodiment of the present invention shown in FIG. 8 has: a lower transparent substrate 12b in FIG. 8; the second wiring portion 16b that is formed of the plurality of thin metal lines 14 formed on the upper surface of the transparent substrate 12b; the second protective layer 20b that is bonded onto the second wiring portion 16b through the second adhesive layer 18b; an upper transparent substrate 12a that is bonded onto and disposed on the second protective layer 20b through for example an adhesive or the like; the first wiring portion 16a that is formed of the plurality of thin metal lines 14 formed on the upper surface of the transparent substrate 12a; and the protective layer 20a that is bonded onto the first wiring portion 16a through the adhesive layer 18a.

Here, the entirety or a part of at least one of the thin metal lines 14 of the first wiring portion 16a and/or second wiring portion 16b is the irregular random mesh pattern 25a shown in FIG. 2.

Figure 9:
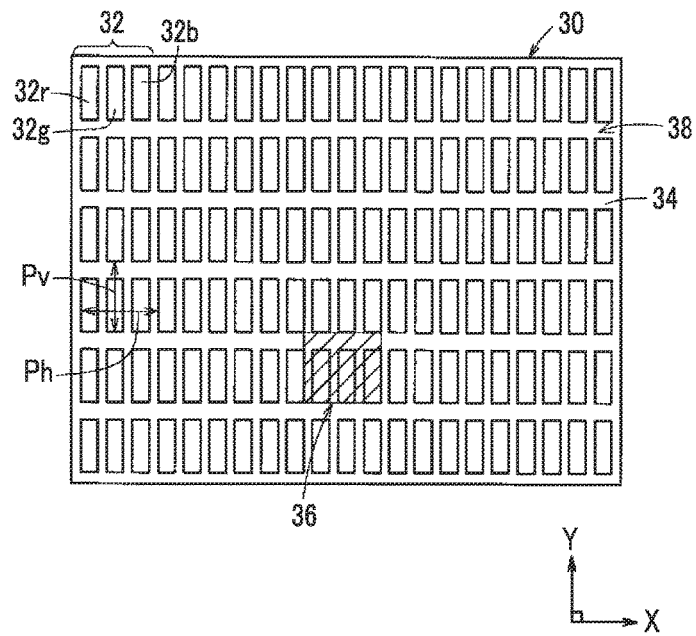
FIG. 9 is a schematic explanatory diagram illustrating an example of a pixel array pattern of a part of the display unit using the conductive film according to the present invention.

The above-mentioned conductive films 10, 11, and 11A of the first, second, and third embodiments of the present invention are applied to, for example, a touch panel (44: refer to FIG. 10) of a display unit 30 (display) schematically shown in FIG. 9. However, from at least one point of view, there is provided an irregular wiring pattern which is optimized in terms of visibility of noise when formed as a combined wiring pattern, with respect to a luminance value of the pixel array (BM) pattern of each color depending on the emission intensity of the display.

In the present invention, the irregular wiring pattern (random mesh pattern), which is optimized in terms of visibility of noise when formed as a combined wiring pattern with respect to the luminance value of the BM pattern of each color depending on the emission intensity of the display, is defined as a single wiring pattern or a group of two or more random mesh patterns making noise not perceived by human visual sensation when formed as a combined wiring pattern, with respect to the BM pattern of the current color even when any color light beam of the light beams with respective colors of the plurality of the subpixels of the display is emitted alone, from at least one point of view. That is, the optimized random mesh pattern is defined as a group of wiring patterns making noise not perceived by human visual sensation when formed as a combined wiring pattern, with respect to a BM pattern of a color in which noise is most likely to occur, for example, a color having a highest luminance value at the time of lighting on for each color of a plurality of colors such as RGB, that is, with respect to a BM pattern having a worst value. In the present invention, a group of two or more random mesh patterns optimized may be ranked, from a random mesh pattern making noise most difficult to be perceived to a random mesh pattern making noise somewhat difficult to perceive, so as to determine one random mesh pattern which makes noise most difficult to perceive.

Here, in the present invention, in terms of optimization of visibility of noise of the wiring pattern, a reason why the luminance value of the BM pattern of each color depending on the emission intensity of the display is used is, for example, as follows. It is assumed that the conductive film has a wiring pattern with line widths and average pitches of the thin metal lines shown in FIG. 11A, and the display has a BM pattern in which one pixel is typified by one sub-pixel as shown in FIG. 11B. In this case, considering one pixel of the display, transmittance image data of the wiring pattern is as shown in FIGS. 11C and 11E. In both the present invention and the related art such as JP2014-041589A, parts corresponding to the line widths of the thin metal lines do not transmit light, and thus 0 can be set, and gaps between the thin metal lines transmit light, and thus 1.0 can be set. As a result, both can be represented as binary data, and each value is completely constant. However, since the BM of the display does not transmit light, a transmittance thereof is 0, but since each sub-pixel (color filter) transmits light, an intensity of the light, for example, a luminance value thereof changes depending on the emission intensity of the display as shown in FIG. 11D. In contrast, transmittance image data of array pattern of the sub-pixels (color filters), that is, the BM pattern of the display according to the related art such as JP2014-041589A is as shown in FIG. 11F. The sub-pixel (color filter) of the display transmits light, and thus 1.0 is set. The BM of the display does not transmit light, and thus 0 is set. Therefore, the emission intensity of the display is not considered.

Meanwhile, as in a high resolution smartphone, if the emission intensity is strong, noise visually perceived is strong, and if the emission intensity is weak, noise visually perceived is weak. Therefore, as in the related art, indicators of evaluation of noises obtained in displays having different emission intensities, that is, quantitative values thereof cannot be compared on the basis of the transmittance image data only. As a result, it is not possible to correctly evaluate the visibility of noise.

Hence, in the present invention, emission intensities of different displays are evaluated and normalized on the basis of an emission intensity of a reference display. Thereby, it is possible to optimize the visibility of noise of the wiring pattern which can be applied to various displays having different emission intensities.

Optimization of visibility of noise of the irregular (random) wiring pattern, which is essential in the present invention, at the luminance value of the BM pattern of each color depending on the emission intensity of the display will be described later.

The conductive film according to the present invention basically has the above-mentioned configuration.

FIG. 9 is a schematic explanatory diagram schematically illustrating an example of a pixel array pattern of a part of the display unit using the conductive film of the present invention.

As the part thereof is shown in FIG. 9, the display unit 30 has a plurality of pixels 32 arranged in a matrix shape to constitute a predetermined pixel array pattern. Each pixel 32 has a configuration in which three sub-pixels (a red sub-pixel 32r, a green sub-pixel 32g, and a blue sub-pixel 32b) are arranged in a horizontal direction. Each sub-pixel has a rectangular shape which is long in the vertical direction. The arrangement pitch (horizontal pixel pitch Ph) of the pixels 32 in the horizontal direction and the arrangement pitch (vertical pixel pitch Pv) of the pixels 32 in the vertical direction are substantially equal to each other. That is, a shape (refer to a region 36 indicated by hatching), which is formed of a single pixel 32 and a black matrix (BM) 34 (pattern material) surrounding the single pixel 32, is a square shape. Further, an aspect ratio of the single pixel 32 is not 1, and satisfies the following expression: a length thereof in the horizontal (transverse) direction>a length thereof in the vertical (longitudinal) direction.

As can be clearly seen from FIG. 9, the pixel array pattern formed of the sub-pixels 32r, 32g, and 32b of each of the plurality of pixels 32 is defined by a BM pattern 38 of BMs 34 respectively surrounding the sub-pixels 32r, 32g, and 32b. Noise, which occurs when the conductive film 10 or 11 is superposed on the display unit 30, is caused by interference between the BM pattern 38 of the BMs 34 of the display unit 30 and the wiring pattern 24 of the conductive film 10 or 11. Therefore, precisely, the BM pattern 38 is an inverted pattern of the pixel array pattern, but here, these patterns are regarded as the same patterns.

For example, the conductive film 10, 11, or 11A may be disposed on a display panel of the display unit 30 having the BM pattern 38 formed by the BMs 34. In this case, the wiring pattern 24 (a combined wiring pattern of the wiring patterns 24a and 24b) of the conductive film 10, 11, or 11A, in which at least one of the wiring patterns 24a and 24b is a random mesh pattern 25a, is optimized in terms of visibility of noise with respect to the BM (pixel array) pattern 38. Therefore, there is no interference in spatial frequency between the array cycle of the pixels 32 and the wiring array of the thin metal lines 14 of the conductive film 10, 11, or 11A, and occurrence of noise is suppressed. As a result, the conductive film is excellent in terms of visibility of noise. Hereinafter, the conductive film 10 will be described as a representative example, but the description is the same as those of the conductive film 11 and 11A.

It should be noted that the display unit 30 shown in FIG. 9 may be formed as a display panel such as a liquid crystal panel, a plasma panel, an organic EL panel, or an inorganic EL panel, and an emission intensity thereof may be different in accordance with a resolution.

The BM pattern and the emission intensity of the display, which can be applied to the present invention, is not particularly limited, and may be the same as the BM pattern and the emission intensity of a known display. For example, as shown in FIGS. 12A, 12B, 13A, 13B, and 13C, a display such as OLED having different cycles and intensities of the respective colors of RGB may be used. A display, which is formed of RGB sub-pixels having the same shapes as shown in FIG. 9 or FIGS. 14A and 14B and in which an intensity variation of the sub-pixels is large, or a display, in which an intensity variation of the sub-pixels is small and only a G sub-pixel (channel) having a highest intensity is considered, may be used. In particular, a display such as a smartphone or a tablet having a high intensity may be used.

Figure 12A:
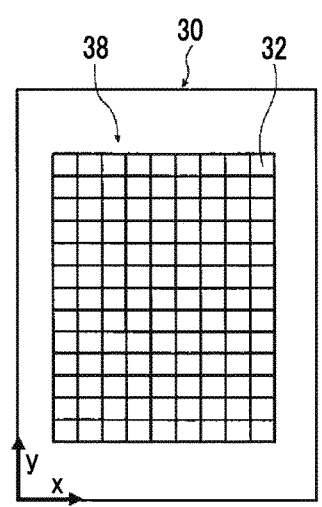
FIGS. 12A and 12B are respectively schematic explanatory diagrams illustrating an example of a part of pixel array patterns of a display unit using the conductive film according to the present invention.
Figure 12B:
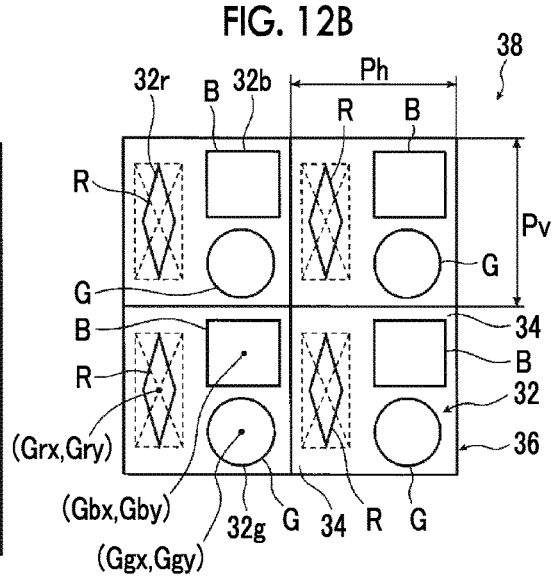

FIGS. 12A and 12B are respectively a schematic explanatory diagram illustrating an example of a part of pixel array patterns of a display unit using the conductive film according to the present invention, and a partially enlarged view of the part.

As shown in FIG. 12A, the display unit 30 has a plurality of pixels 32 arranged in a matrix shape to constitute a predetermined pixel array pattern. As shown in FIG. 12A, each pixel 32 has a configuration in which three sub-pixels (a red sub-pixel 32r, a green sub-pixel 32g, and a blue sub-pixel 32b) are arranged in a horizontal direction.

In the present invention, it is necessary for the pixel array pattern of the display unit to satisfy any of the following three conditions: a condition in which at least two sub-pixels among a plurality of sub-pixels in a single pixel, the three sub-pixels in the example shown in the drawing, have different shapes; a condition in which cycles of sub-pixel array patterns formed by arrays each corresponding to at least two sub-pixels among a plurality of (three) sub-pixels in a single pixel are different; or a condition in which a plurality of (three) sub-pixels in a single pixel is not lined up in one direction. In addition, in the present invention, the cycles of the sub-pixel array patterns, that is, the cycles of the sub-pixels (color filters) also include a cycle of sub-pixels in a single pixel.

In the example shown in FIG. 12B, each sub-pixel 32r has a rhomboid shape that is vertically long in the y (vertical) direction in the drawing, and is disposed on the left side of each square-shaped pixel 32 in the drawing, each sub-pixel 32g has a circular shape, and is disposed on the lower right side of the pixel 32 in the drawing, and each sub-pixel 32b has a rectangular shape (square shape), and is disposed on the upper right side of the pixel 32 in the drawing. In the display unit 30 shown in FIGS. 12A and 12B, a pixel array pattern 38 corresponds to a case where forms of three sub-pixels 32r, 32g, and 32b within a single pixel are different such that intensities thereof are different, and corresponds to a case where a plurality of (three) sub-pixels in a single pixel is not lined up in a single direction.

In the example shown in the drawing, the arrangement pitch (horizontal pixel pitch Ph) of the pixels 32 in the horizontal direction and the arrangement pitch (vertical pixel pitch Pv) of the pixels 32 in the vertical direction are substantially equal to each other, and are referred to as a pixel pitch Pd. That is, a region, which is formed of the three sub-pixels 32r, 32g, and 32b of a single pixel 32, and a pixel region 36, which is formed of a black matrix (BM) 34 (pattern material) surrounding the sub-pixels 32r, 32g, and 32b, have square shapes. It should be noted that the pixel region 36 corresponds to a single pixel 32, and therefore the pixel region 36 is hereinafter also referred to as a pixel.

It should be noted that the pixel pitch Pd (the horizontal or vertical pixel pitch Ph or Pv) may have any value if it is a pitch corresponding to a resolution of the display unit 30, and may be, for example, a pitch in a range of 84 μm to 264 μm.

In the examples shown in the drawing, the shapes of the sub-pixels 32r, 32g, and 32b within one pixel are respectively a rhomboid, a circle, and a rectangle. However, the present invention is not limited to this, and the shapes may be any shapes if there is provided the pixel array pattern 38. In the pixel array pattern 38, three sub-pixels having the same forms shown in FIG. 13A are lined up in the horizontal direction of the drawing, each pixel 32 is repeated in the horizontal direction and the vertical direction, and the cycles and intensities of the sub-pixels (color filters) are the same for the three sub-pixels of RGB.

Figure 13A:
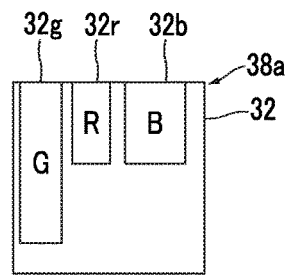
FIGS. 13A to 13C are respectively schematic explanatory diagrams illustrating examples of constituent units of pixel array patterns in which at least either shapes or cycles of three sub-pixels applied to the present invention are different.
Figure 13B:
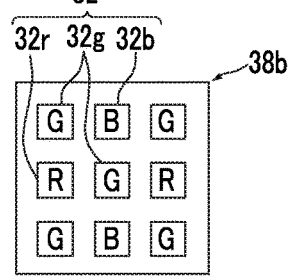
Figure 13C:
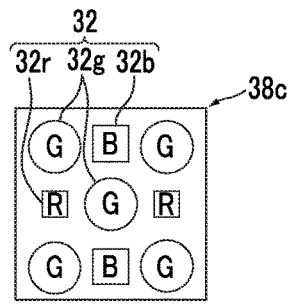
Figure 14A:
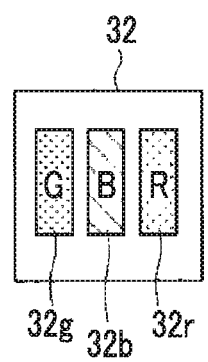
FIGS. 14A and 14B are respectively explanatory diagrams schematically illustrating examples of variations of intensities of three sub-pixels in the pixels of the pixel array pattern of the display unit shown in FIG. 9.
Figure 14B:
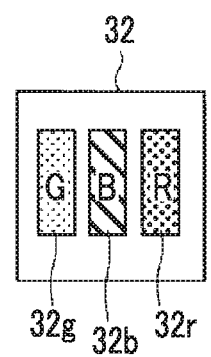

Alternatively, the sub-pixels (color filters) 32r, 32g, and 32b having opening shapes called a pin tile structure shown in FIGS. 13A to 13C may be used. In addition, there may be provided pixel array patterns each of which is formed of the sub-pixels 32r, 32g, and 32b.

As shown in FIG. 13A, the forms of the three sub-pixels 32r, 32g, and 32b of the pixel 32 may be different (the shapes may be rectangles, but the sizes thereof may be different). This case corresponds to the case where the intensities thereof are different. In this case, it can be said that the cycles of the sub-pixels are the same.

That is, in the example shown in FIG. 13A, the pixel array pattern 38a is formed such that each pixel is formed of the three sub-pixels 32r, 32g, and 32b having different forms. Any of the cycles of the respective sub-pixel array patterns of the three sub-pixels 32r, 32g, and 32b is the same as the cycle of the pixel array pattern 38a.

It should be noted that in the present invention, the condition, in which the forms of the sub-pixels are different, is defined to include not only a case where the shapes of the sub-pixels are different but also a case where the sizes of the sub-pixels are different.

As shown in FIG. 13B, even when the forms of the three sub-pixels 32r, 32g, and 32b are the same, a repetition cycle (the cycle of the sub-pixel array pattern) of the sub-pixels 32g may be different from repetition cycle of the sub-pixels 32r and 32b. In this example, the cycle of the sub-pixels 32g is a half of the cycle of the sub-pixels 32r and 32b. In this case, it can be said that the intensities of the sub-pixels are the same.

That is, in the example shown in FIG. 13B, a pixel array pattern 38b is formed such that each pixel 32 is formed of four sub-pixels including the two sub-pixels 32g and the sub-pixels 32r and 32b. Either of the cycles of the respective sub-pixel array patterns of the sub-pixels 32r and 32b is the same as the cycle of the pixel array pattern 38b. The cycle of the sub-pixel array pattern of the sub-pixels 32g is a half of the cycle of the pixel array pattern 38b.

As shown in FIG. 13C, the repetition cycle (the cycle of the sub-pixel patterns) and the form (both the shape and the size) of the sub-pixels 32g may be different from those of the sub-pixels 32r and 32b. This case corresponds to the case where both the cycles and the intensities of the sub-pixels are different.

That is, in the example shown in FIG. 13C, in a manner similar to the example shown in FIG. 13B, a pixel array pattern 38c is formed such that each pixel 32 is formed of four sub-pixels including the two sub-pixels 32g and the sub-pixels 32r and 32b. Either of the cycles of the respective sub-pixel array patterns of the sub-pixels 32r and 32b is the same as the cycle of the pixel array pattern 38c. The cycle of the sub-pixel array pattern of the sub-pixels 32g is a half of the cycle of the pixel array pattern 38c.

FIG. 14A shows a BM structure of a pixel in which an intensity variation of GBR sub-pixels is large and which is formed of RGB sub-pixels having the same shapes. FIG. 14B shows a BM structure of a pixel in which an intensity variation of GBR sub-pixels is small and which is formed of RGB sub-pixels having the same shapes. Considering only a G sub-pixel having a highest intensity, a wiring pattern of the conductive film can be designed.

The resolutions and intensities of the BMs each having 2×2 pixels of the display used in the present invention are shown in FIGS. 15A1 to 15H2. Resolutions, shapes, or intensities (luminances) of the respective BMs shown in FIGS. 15A1 to 15H2 are different. FIGS. 15A1 to 15H2 show only the G channel (G sub-pixels), and do not show the B channel (B sub-pixels) and the R channel (R sub-pixels), but it is apparent that the resolutions and the shapes thereof are the same.

FIGS. 15A1 and 15A2 each show four G sub-pixels having reed shapes, which are curved toward the center and the left side in the drawing, at a resolution of 149 dpi, where intensities thereof are 0.5 and 1.0 when the intensities of the reference display are normalized, and respectively correspond to the BMs of BM Nos. 1 and 2 used in the example to be described later.

FIGS. 15B1 and 15B2 each show two G sub-pixels having band shapes which extend in the vertical direction in the drawing, at a resolution of 222 dpi, where intensities thereof are 0.5 and 1.0 when the intensities of the reference display are normalized, and respectively correspond to the BMs of BM Nos. 3 and 4 used in the example to be described later.

FIGS. 15C1 and 15C2 each show four G sub-pixels having plate shapes which are arranged in the horizontal direction in the drawing, at a resolution of 265 dpi, where intensities thereof are 0.5 and 1.0 when the intensities of the reference display are normalized, and respectively correspond to the BMs of BM Nos. 5 and 7 used in the example to be described later.

FIGS. 15D1 and 15D2 each show four G sub-pixels having plate shapes which are arranged in the vertical direction in the drawing, at a resolution of 265 dpi, where intensities thereof are 0.5 and 1.0 when the intensities of the reference display are normalized, and respectively correspond to the BMs of BM Nos. 6 and 8 used in the example to be described later.

FIGS. 15E1 and 15E2 each show four G sub-pixels having rectangular shapes which are arranged in the horizontal direction in the drawing, at a resolution of 326 dpi, where intensities thereof are 0.5 and 1.0 when the intensities of the reference display are normalized, and respectively correspond to the BMs of BM Nos. 9 and 10 used in the example to be described later.

FIGS. 15F1 and 15F2 each show four G sub-pixels having small rectangular shapes which are arranged in four angular directions in the drawing, at a resolution of 384 dpi, where intensities thereof are 0.5 and 1.0 when the intensities of the reference display are normalized, and respectively correspond to the BMs of BM Nos. 11 and 13 used in the example to be described later.

FIGS. 15G1 and 15G2 each show four G sub-pixels having triangular shapes which are arranged in directions of four sides in the drawing, at a resolution of 384 dpi, where intensities thereof are 0.5 and 1.0 when the intensities of the reference display are normalized, and respectively correspond to the BMs of BM Nos. 12 and 14 used in the example to be described later.

FIGS. 15H1 and 15H2 each show four G sub-pixels having rectangular shapes which are arranged in the vertical direction in the drawing, at a resolution of 440 dpi, where intensities thereof are 0.5 and 1.0 when the intensities of the reference display are normalized, and respectively correspond to the BMs of BM Nos. 15 and 16 used in the example to be described later.

For example, the conductive film 10, 11, or 11A may be disposed on a display panel of the display unit 30 having the BM pattern 38 formed by the BMs 34 that defines the above-mentioned sub-pixel array pattern of RGB. In this case, the wiring pattern 24 is a random mesh pattern that is optimized as a combined wiring pattern in terms of visibility of noise and further randomized with respect to the luminance value of the BM (pixel array) pattern 38 including the sub-pixel array patterns of RGB. Therefore, there is almost no interference in spatial frequency between the array cycle or intensity of the pixels 32 and the wiring array of the thin metal lines 14 of the conductive film 10, 11, or 11A, and occurrence of noise is suppressed.

However, the pixel array pattern of the display, which is used when optimization of noise is optimized, is precisely defined by each sub-pixel array pattern of the plurality of colors such as RGB, for example, repetition frequencies and shapes of the sub-pixels. Therefore, it is necessary to accurately define a resolution of the sub-pixels with respect to the resolution of the display. However, in the present invention, it is necessary to use the light intensity of the pixel array pattern of the display, for example, the luminance value (luminance image data). Therefore, in terms of the intensity frequency, it can be said that it is not necessary to clearly divide RGB since a problem arises in that sub-pixels (indicate a single channel) with a certain intensity are arranged in a certain manner. Accordingly, in order to design an irregular (random) mesh pattern optimum which is optimal for the display, when quantitative values of evaluation of noise are calculated, a worst value thereof at the time of lighting on for each color of RGB may be used. Consequently, in order to design a random mesh pattern which is optimal for the display, when indicators, that is, quantitative values of evaluation of noise are calculated, a worst value thereof at the time of lighting on for each color of RGB may be used.

Figure 10:
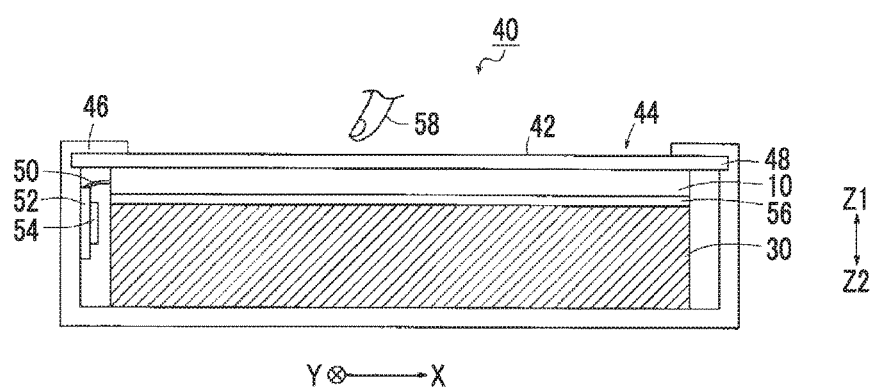
FIG. 10 is a schematic cross-sectional view of one example of a display device provided with the conductive film shown in FIG. 1.

Next, a display device, in which the conductive film of the present invention is incorporated, will be described with reference to FIG. 10. In FIG. 10, a projected capacitive type touch panel, in which the conductive film 10 according to the second embodiment of the present invention is incorporated, will be described as a representative example of a display device 40, but it is needless to say that the present invention is not limited to this example.

As shown in FIG. 10, the display device 40 includes the display unit 30 (refer to FIG. 9) that can display a color image and/or a monochrome image, a touch panel 44 that detects a contact position on an input surface 42 (located on the side as directed by the arrow Z1), and a housing 46 in which the display unit 30 and the touch panel 44 are housed. A user is able to access the touch panel 44 through a large opening portion provided in one surface (on the side as directed by the arrow Z1) of the housing 46.

The touch panel 44 includes not only the conductive film 10 (refer to FIGS. 1 and 2) described above but also a cover member 48 stacked on one surface (on the side as directed by the arrow Z1) of the conductive film 10, a flexible substrate 52 electrically connected to the conductive film 10 through a cable 50, and a detection control unit 54 disposed on the flexible substrate 52.

The conductive film 10 is bonded to one surface (on the side directed by the arrow Z1) of the display unit 30 through an adhesive layer 56. The conductive film 10 is disposed on the display screen such that the other main surface side (second wiring portion 16b side) is opposite to the display unit 30.

The cover member 48 functions as the input surface 42 by covering one surface of the conductive film 10. In addition, by preventing a contact member 58 (for example, a finger or a stylus pen) from coming into direct contact with the conductive film 10, it is possible to suppress the occurrence of a scratch, adhesion of dust, and the like, and thus it is possible to stabilize conductivity of the conductive film 10.

The material of the cover member 48 may be, for example, glass or a resin film. One surface (on the side as directed by the arrow Z2) of the cover member 48 may be coated with silicon oxide or the like, and may be adhered to one surface (on the side as directed by the arrow Z1) of the conductive film 10. Further, in order to prevent damage due to rubbing or the like, the conductive film 10 and the cover member 48 may be configured to be bonded to each other.

The flexible substrate 52 is an electronic substrate having flexibility. In the example shown in this diagram, the flexible substrate 52 is fixed to an inner wall of the housing 46, while the position of the substrate may be varied. The detection control unit 54 constitutes an electronic circuit that catches a change in the capacitance between the contact member 58 and the conductive film 10 and detects the contact position (or the approach position) when the contact member 58 as a conductor is brought into contact with (or comes closer to) the input surface 42.

The display device, to which the conductive film according to the present invention is applied, basically has the above-mentioned configuration.

Next, in the present invention, processes of performing optimization and randomization in terms of visibility of noise on a wiring pattern of the conductive film with respect to a pixel array (BM) pattern of the display device having a predetermined intensity (luminance value) will be described. That is, a description will be given of the processes of evaluating and determining an irregular (random) wiring pattern which is optimized such that noise with respect to a predetermined pixel array (BM) pattern of the display device with a predetermined intensity is not perceived by human visual sensation, from at least one point of view, in the conductive film according to the present invention.

FIG. 16 is a flowchart illustrating an example of a method of evaluating the conductive film of the present invention.

In the method of evaluating the wiring pattern of the conductive film of the present invention, first, luminance image data of the BM (pixel array) patterns at the time of lighting on for each color of the plurality of colors (for example, RGB) of the display unit of the display device is acquired. Further, the irregular wiring pattern used in one of the upper and lower sides of the conductive film and the wiring pattern used in the other are generated, whereby the transmittance image data is acquired, and the transmittance image data of the combined wiring pattern is acquired. Here, the wiring pattern used in the other may be the irregular wiring pattern, and may be the regular wiring pattern.

Next, on the basis of the frequencies and the intensities of noises which are obtained through frequency analysis using fast Fourier transforms (FFT) of the transmittance image data of the combined wiring pattern and the BM pattern, noises (frequencies and intensities) of the respective colors with frequencies equal to or less than a highest frequency of noises and predetermined intensities defined in accordance with a display resolution of the display unit are collected.

Subsequently, evaluation values of noises of the respective colors are obtained by applying human visual response characteristics to intensities of noises at the frequencies of the collected noises of the respective colors in accordance with the observation distance, and an indicator of evaluation (quantitative value) of noises is calculated on the basis of obtained quantitative values of the plurality of noises.

Next, an irregular wiring pattern, which constitutes a combined wiring pattern satisfying conditions where the calculated indicator of evaluation of noise is set in advance, is evaluated as a wiring pattern optimized such that noise is not visually perceived, and determined as the optimized irregular wiring pattern.

In the method according to the present invention, FFT is generally used for the frequencies and intensities of noises, and the following processes are defined because the frequency and intensities of a target may greatly vary depending on the way of usage.

One of the upper and lower wiring portions 16*a* and 16*b* of the conductive film may be formed of the plurality of thin metal lines 14 having the irregular wiring pattern, and the other wiring portion may be formed as a transparent conductive layer such as ITO having the wiring pattern. In this case, transmittance image data of the combined wiring pattern of both wiring patterns is indicated by transmittance image data of one irregular wiring pattern formed of the plurality of thin metal lines 14. However, hereinafter, even in this case, the above-mentioned transmittance image data is treated as transmittance image data of the combined wiring pattern of both wiring patterns.

In the present invention, first, it is preferable that the following is considered: the display screen of the display unit of the display device is observed from one point of view in the front. In this case, the present invention is not limited to this, but the display screen may be observed from any point of view if visibility of noise can be improved in a case where observation is performed from at least one point of view.

As might be expected, in the present invention, it is preferable that the following cases are considered: a case where the display screen is observed from the front (a case of front observation); and a case where the display screen is obliquely observed (a case of oblique observation).

Hereinafter, the following item will be described: imaging is performed for each color on the BM (pixel array) pattern which has sub-pixels with three colors such as RGB.

In the method according to the present invention, as shown in FIG. 16, first, in step S10 as process 1, in order to deal with display quantitatively, transmittance image data (BM data) of the display is created.

Here, a method of creating display BM data in step S10 is shown in detail in FIG. 17.

FIG. 17 is a flowchart illustrating a specific example of the method of creating display BM data in the method of evaluating the conductive film of the present invention.

As shown in FIG. 17, first, in step S30, imaging of the display is performed using a microscope. That is, in step S30, an image of the display screen (an image of the sub-pixel array pattern of each color) of the display unit of the display device is captured for each color of RGB.

In step S30, first, the display unit 30 of the display device 40 is turned on for each color of RGB. At this time, it is preferable that the luminance is maximized in a range in which it can be obtained through setting change of a light emitting side (display device 40).

Subsequently, an image of the sub-pixels is captured in a state where the sub-pixels of each color of RGB are lit on. That is, an image of transmitted light of each of the sub-pixels (RGB color filters) 32*r*, 32*g*, and 32*b* of the pixel array patterns 38 (38*a* to 38*c*) of the display unit 30 shown in FIGS. 9, 12B, and 13A to 13C is captured by using a microscope. In the imaging, it is preferable that white balance of a microscope is adjusted to white color of Macbeth chart.

A target display, and a microscope, a lens, and a camera used in imaging are not particularly limited, but, for example, LP101WX1(SL) (n3) (manufactured by LG DISPLAY Corp.) can be used as the display, STM6 (manufactured by OLYMPUS Corp.) can be used as the microscope, UMPlanFl10x (manufactured by OLYMPUS Corp.) can be used as the lens, and QIC-F-CLR-12-C (manufactured by QIMAGING Corp.) can be used as the camera.

In the example of the present invention, the LP101WX1 (SL) (n3) is used as the display, first, only the G channel is lit on with a maximum (MAX) intensity, the STM6 manufactured by OLYMPUS Corp. is used as the microscope, the UMPlanFl10x manufactured by OLYMPUS Corp. is used as the objective lens, and thereby imaging is performed.

Here, as the imaging conditions, for example, an exposure time period can be set to 12 ms, a gain can be set to 1.0, and white balance (G, R, B) can be set to (1.00, 2.17, 1.12). In addition, it is preferable that the captured image is subjected to shading correction.

Figure 18A:
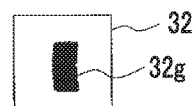
FIG. 18A is a schematic diagram illustrating an example of a captured image of a G sub-pixel of the display unit using the conductive film according to the present invention.

As a result, it is possible to acquire an image of one pixel of a G channel sub-pixel shown in FIG. 18A.

Here, in the present invention, the display is not limited, and any display may be used as a reference display, but it is preferable that the LP101WX1(SL) (n3) is used as a reference of the display.

Further, the BM pattern of the display LP101WX1(SL) (n3) has the BM patterns shown in FIGS. 15A1 and 15A2. It should be noted that FIGS. 15A1 and 15A2 show only G channel patterns but the same configuration is applied to the RB channels.

An image of one pixel of each sub-pixel of the RB channels can also be captured in the same manner as an image of one pixel of the G channel sub-pixel.

Next, after imaging, RGB luminance pixel information (luminance image data) is acquired by measuring spectra of the sub-pixel images through a spectrometer (small fiber optical spectrometer) and performing luminance conversion on the basis of the measured spectrum data.

For example, as described below, RGB sub-pixel (BM) input data may be created using the spectrometer.

Figure 18B:
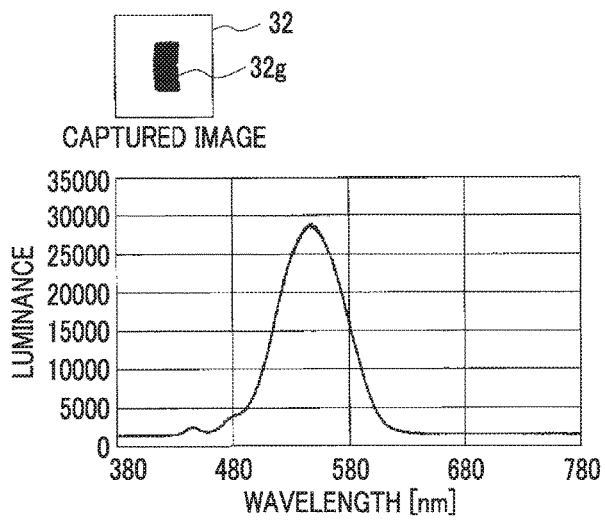
FIG. 18B is a graph illustrating an example of a spectrum of the G sub-pixel.

1. First, in step S32, measurement of the luminances is performed. The sub-pixels of the G channel of the display unit 30 are lit on in a single color, and light is measured by the spectrometer. As a result, for example, spectrum data shown in FIG. 18B can be obtained from the G sub-pixels. Spectrum data can be obtained from the RB sub-pixels in the same manner as the G sub-pixels.

In luminance measurement, a spectrometer USB2000+ manufactured by OCEAN OPTICS Inc. is used, a diffuser plate (CC-3-UV-S manufactured by OCEAN OPTICS Inc.) at the leading end of a fiber of the spectrometer is used, and an integration time period is set to 250 ms.

2. Next, in step S34, the image, which is captured through the microscope in step S30, is masked and binarized, and a mask image is created from image data of the captured image. In a method of creating the mask image, in a case of the G channel, for the G channel of the captured image data, an average value of pixel sizes of the light-on BMs is calculated, and mask data is acquired when the average value is set to a threshold value. Then, the mask image is created. The threshold value is an average value of only the G channel of an image corresponding to one pixel in the captured image. Also in a case of RB channel, in a manner similar to that of the G channel, the mask image is created from the image data of the captured image.

3. Subsequently, the luminance data, which is normalized by a resolution x an area having a mask image value, is given to the obtained mask image, and is set as input data.

Figure 19:
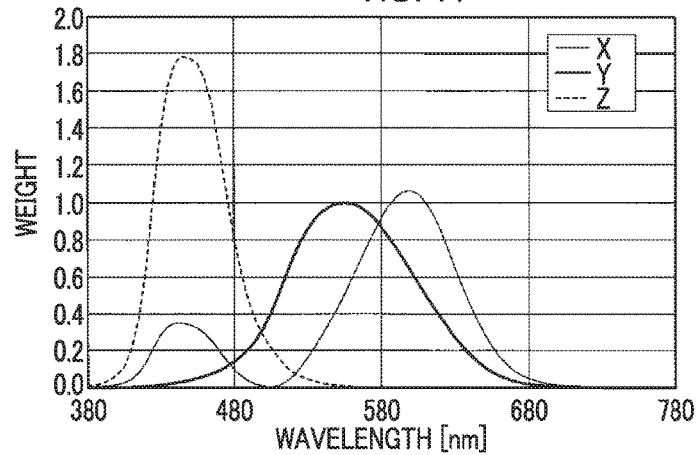
FIG. 19 is a graph illustrating an example of XYZ color matching functions applied to the present invention.

That is, a location of 1 of (0, 1) mask data of the mask image obtained in the section 2 is replaced with an integral value through the XYZ color matching functions shown in FIG. 19 in the spectrum data obtained in the section 1. For example, if the input data of the G sub-pixel is intended to be created, a product (G×Y) between the spectrum data G of G shown in FIG. 18B and the spectrum data Y of the luminance Y of the XYZ color matching function shown in FIG. 19 may be acquired. In addition, if the input data of the B sub-pixel is intended to be created, a product (B×Y) between the spectrum data B of B and the spectrum data Y of the luminance Y of the XYZ color matching function shown in FIG. 19 may be acquired. Likewise, the input data of the R sub-pixel may be created. At this time, the calculated luminance value (luminance data) Y is proportional to an opening area (area having the mask image value) of the sub-pixels and the number of pixels (resolution) included in a sensor of the spectrometer, and is therefore normalized by the number of pixels x the opening area, that is, the resolution x the area having the mask image value. The reason for this is that a macro luminance can be regarded as a value which is obtained by multiplying the opening area of the sub-pixels by the number of pixels included in the sensor in a case where the sub-pixels are regarded as a set of infinitesimal light sources.

Figure 18C:
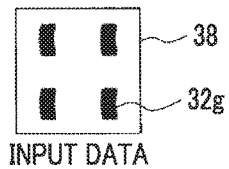
FIG. 18C is a schematic diagram illustrating an example of input data of 2×2 pixels.

Subsequently, in step S36, the resolution of the microscope image is different from desired input data (12700 dpi). Therefore, the input data pieces of the RGB sub-pixels obtained in step S34 each are expanded and compressed (reduced) in a bicubic method, the display luminance of the present example is normalized to 1.0 in step S38, and display BM data (normalized luminance image data) is created as input data of 2 pixels×2 pixels shown in FIG. 18C.

In such a manner, it is possible to acquire the display BM data.

The display BM data, which is obtained in such a manner, becomes normalized luminance image data which is normalized on the basis of the luminance of the reference display. Therefore, even compared with another display, the comparison can be performed on the basis of absolute values.

Meanwhile, before the two-dimensional fast Fourier transform (2DFFT (base 2)) is performed on the display BM data, it is preferable that input data of 2 pixels×2 pixels is repeatedly copied by an integer multiple approximate to an image size of 5000 pix×5000 pix, and thereby the normalized luminance image data is created as input data for noise evaluation. Here, the image size is arbitrary, and may be set to, for example, 20000 pix×20000 pix.

It should be noted that the input data pieces of the RGB sub-pixels obtained in step S34 each may be set at a resolution of 12700 dpi which is a high resolution through bilinear interpolation, without creation of the input data of 2 pixels×2 pixels, and an image size thereof may be bicubic-converted into 109 pix (pixels)×109 pix (pixels). It should be noted that, if the resolution of the optical imaging system is given, it is possible to calculate the values in accordance with the resolution.

Subsequently, the normalized luminance image, of which the image size is 109 pix×109 pix, with the resolution of 12700 dpi is repeatedly copied by an integer multiple (45 times) approximate to an image size of 5000 pix×5000 pix for each color of RGB, and thereby the normalized luminance image data as input data for noise evaluation may be created.

The method of acquiring the display BM data (normalized luminance image data) indicating the RGB luminance pixel information by capturing images of the RGB sub-pixel array patterns of the display unit 30 is not limited to the method of measuring spectra of the respective sub-pixel images through the above-mentioned spectrometer and performing luminance conversion on the basis of the measured spectrum data. The captured image data may be directly converted into luminance values of the respective colors (RGB).

For example, on the basis of captured image data of the captured image of the sub-pixel array pattern of each color, a luminance value of each color (RGB) is converted, and luminance data (total three data pieces) of RGB is created on the basis of a luminance of the display=1.0.

Assuming that red image data is R, green image data is G, blue image data is B, and the luminance value is Y, for conversion from the captured image into the luminance value, Y (luminance value) is calculated through the following conversion Expression (2), and R, G, and B color filter images (luminance ratio images) are created.

$$Y=0.300R+0.590G+0.110B \quad (2)$$

The maximum value of the G sub-pixel (color filter) image (luminance ratio image) obtained in such a manner is 1.0 (=0.25*255), that is, the luminance images of the R, G, and B sub-pixels as references are normalized. Thereby, a normalized luminance image (image data) of each of the RGB sub-pixels can be created.

Next, in process 2, in order to quantify the mesh-shaped wiring pattern 24 of the conductive film 10, an image (transmittance image data) of a combined wiring pattern of the upper and lower wiring patterns 24a and 24b of the conductive film 10 is created. It should be noted that at least one of the wiring patterns 24a and 24b is an irregular mesh pattern (hereinafter referred to as a random mesh pattern). As described above, the random mesh pattern may be on one single side, and a wiring pattern using the transparent conductive layer such as ITO may be on the other single side. In this case, an image (transmittance image data) of a combined wiring pattern of both is indicated by an image (transmittance image data) of the random mesh pattern on the single side.

As shown in FIG. 16, in step S12, the transmittance image data of the combined wiring pattern including the random mesh pattern is created.

Here, the transmittance image (data) of the random mesh pattern 25a used as at least one of the upper and lower wiring patterns 24a and 24b is created. In the process, first, as shown in FIG. 3 mentioned above, it is preferable that dots are generated at a plurality of positions randomly selected with arbitrary intervals in a planar region 100 and the dots are set as a plurality of seed points p. Next, as shown in FIG. 2, it is preferable that the random mesh pattern 25a having Voronoi polygons, which are determined in accordance with the Voronoi diagram (Voronoi division method) on the basis of dot data of the obtained plurality of seed points, as the opening portions 22 is created, and the transmittance image data is acquired. Here, the method of creating the random mesh pattern may be any method using Delaunay triangles.

In addition, as described above, instead of the transmittance image (data) of the random mesh pattern 25a, a transmittance image of a random mesh pattern 25b, 25c, 25d, or 25e shown in FIG. 23, 25A, 25B, or 25C may be created. Here, for example, as shown in FIG. 24A mentioned above, regarding the random mesh pattern 25b, the seed points p are anisotropically arranged by providing anisotropy to dots regularly arranged in the planar region 110. Then, as shown in FIG. 24B, the rhomboid patterns 114 are formed around the seed points p, and thereafter thinning processing is performed, whereby the random mesh pattern 25b shown in FIG. 23 may be created.

In a case where the random mesh pattern 25a is used as the upper and lower wiring patterns 24a and 24b, transmittance image data of a combined wiring pattern in a state where the two random mesh patterns 25a overlaps on the basis of the transmittance image data of both patterns is created.

In a case where the random mesh pattern 25a is used in only one of the upper and lower wiring patterns 24a and 24b, separately transmittance image data of the other wiring pattern is acquired, and the transmittance image data of the combined wiring pattern in a state where both patterns overlap on the basis of the transmittance image data of both patterns is created. At this time, in a case where the other wiring pattern is a wiring pattern of the transparent conductive layer such as ITO, the transmittance image data of the combined wiring pattern is created such that values of the transmittance image data are 1.0 as a whole.

It should be noted that at least one transmittance image data piece of the combined wiring pattern, the random mesh pattern 25a, and the other wiring pattern of the mesh-shaped wiring patterns 24a and 24b may be provided or stored in advance. In this case, transmittance image data may be acquired from the provided or stored transmittance image data.

In addition, in the present example, dot data of the seed points p randomly generated in the planar region 100 shown in FIG. 3 is as follows.

First, for example, a canvas having the planar region 100 corresponding to 10 mm (5000 pix×5000 pix) at a resolution of 12700 dpi (2 μm/pix) is prepared. In the canvas, the pitch of a mesh is assumed, and the required number of dots are arranged. For example, regarding the number of dots, assuming that the pitch is 50 μm, since the canvas size is 5000 pix×5000 pix, 50 μm corresponds to 25 pix. Therefore, if the size is divided by 25 pix, 200×200=40000 dots are required. Those are randomly arranged. For example, a combination (a pitch, a dot number) of the assumed pitch and dot number has totally four types of (50 μm, 40000 dots), (1000 μm, 10000 dots), (200 μm, 2500 dots), and (300 μm, 1111 dots). For example, 2 μm and 4 μm are used as line widths at the time of rendering the random mesh pattern.

Further, when the transmittance image data of the random mesh pattern and the transmittance image data of the combined wiring pattern are created, a resolution thereof is set to, for example, 25400 dpi. In addition, the size of the transmittance image data is defined such that the pixel size is set as, for example, an integer multiple of the size (for example, 109 pix×109 pix) of a cyclic unit approximate to 20000 pix×20000 pix, similarly to the case of the BM pattern 38. In such a manner, the transmittance image data can be created with the defined size.

Next, in process 3, by performing two-dimensional fast Fourier transform (2DFFT (base 2)) on each of the normalized luminance image data of the sub-pixels created in process 1 (step S10) and the transmittance image data of the combined wiring pattern created in process 2 (step S12) and by quantifying both transmittance image data pieces, a spatial frequency of the spectrum peak and a peak spectrum intensity are calculated.

That is, as shown in FIG. 16, in step S14, first, by performing 2DFFT (the image size is 5000 pix×5000 pix) on the transmittance image data of the combined wiring pattern and the luminance image data of the sub-pixel array pattern (BM pattern) of each color of the BM pattern 38 for each color of RGB, Fourier spectra are calculated. Here, it is preferable that normalization is performed such that an intensity of a DC component (direct current component) is an average value of an image.

First, the peak frequency and the peak intensity are obtained by performing 2DFFT on the luminance image data for noise evaluation obtained in step S10. Here, the peak intensity is treated as an absolute value of the Fourier spectrum.

This process is repeatedly performed for each color of RGB. At this time, if all small intensities not contributing to noise are used, there is concern that calculation may become complicated and accuracy thereof may not be correctly evaluated. Therefore, it is preferable to provide a threshold value on the basis of the intensity. For example, in a case where the absolute value of the spectrum intensity is represented as a common logarithm, it is preferable to employ a value which is larger than −2.2 ($\log_{10}$(intensity)>−2.2).

Figure 20A:
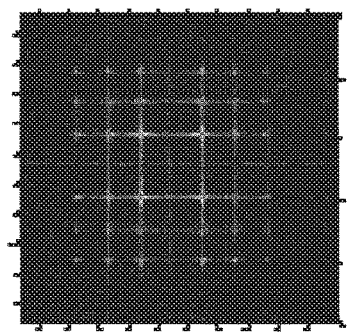
FIGS. 20A and 20B are respectively diagrams illustrating intensity characteristics of two-dimensional Fourier spectra of respective transmittance image data pieces of the pixel array pattern shown in FIG. 15A1 and the random mesh pattern shown in FIG. 2.

FIG. 20A shows an example of intensity characteristics of two-dimensional Fourier spectrum of the luminance image data of the G color (sub-pixel array pattern) obtained in such a manner.

Subsequently, by performing the 2DFFT on the transmittance image data of the combined wiring pattern created in step S12, the peak frequency and the peak intensity of the plurality of spectrum peaks of the two-dimensional Fourier spectra of the transmittance image data of the combined wiring pattern are calculated. Here, the peak intensity is treated as an absolute value. For simplification of calculation, for example, in a case where the absolute value of the spectrum intensity is represented as a common logarithm, it is preferable that, only a threshold value of the intensity greater than −3.0 is treated.

Figure 20B:
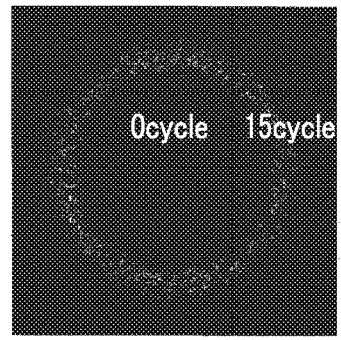

FIG. 20B shows an example of intensity characteristics of the two-dimensional Fourier spectra of the transmittance image data of the combined wiring pattern obtained in such a manner. In the present invention, the visibility of noise is set as the evaluation target. For this reason, regarding the intensity threshold value of the spectrum peak considered in the evaluation, contrary to the case of the moiré which has discretely present strong (high) peak intensities as the evaluation target, it is necessary to evaluate the distribution state. Therefore, it is necessary to consider even weaker (lower) peak intensities in the evaluation, and as a result, a smaller threshold value is used.

In the drawing showing distribution of intensities of the two-dimensional Fourier spectrum shown in FIG. 20B, the horizontal axis and the vertical axis indicate spatial frequencies (cycle/mm) in respective two-dimensional axes, for example, the X axis and Y axis directions. The center of this distribution diagram, that is, the origin indicates that the spatial frequency is 0 cycle/mm, and the radius r as a distance from the center indicates the spatial frequency (cycle/mm). Further, in the same drawing, the intensity level (spectrum value) decreases as the display density becomes thicker (black) for each spatial frequency band, and the intensity level increases as the display density becomes thinner (white). In the example of the drawing, the intensity distribution characteristics of the two-dimensional spectrum shows that there is a single isotropic and annular peak, and shows that spectral peaks having approximately the same spatial frequency, for example, spatial frequencies of around 15 cycle/mm are isotropically distributed. That is, the random mesh pattern indicates that the average pitch of the cells (opening portions 22) is around 67 μm.

In a case of changing a point of view, a spatial frequency of the mesh of the combined wiring pattern, an intensity thereof, and a spectrum intensity of the BM are different from those in the front view. For example, if the point of view for the combined wiring pattern is set at 30°, an amount of deviation between the upper mesh pattern and the lower mesh pattern may be set in consideration of a substrate thickness (for example, PET: 100 μm). The spectrum intensity of the BM may be 0.9 times the intensity thereof in the front view.

As described above, FIGS. 20A and 20B are respectively diagrams illustrating the intensity characteristics of the two-dimensional Fourier spectra of the transmittance image data of the combined wiring pattern and the luminance image data of the G color (sub-pixel array pattern) of the BM pattern 38.

In FIGS. 20A and 20B, white portions have high intensities, and indicate spectrum peaks. Therefore, from the results shown in FIGS. 20A and 20B, the peak frequencies and the peak intensities of spectrum peaks are calculated respectively for the transmittance image data of the combined wiring pattern and the luminance data of the BM pattern 38 at the time of lighting on for each color depending on the sub-pixel array patterns of three colors such as RGB of the BM pattern 38. In other words, positions of the spectrum peaks on frequency coordinates in the intensity characteristics of the two-dimensional Fourier spectra of the transmittance image data of the combined wiring pattern and the luminance data of the BM pattern 38 (the sub-pixel array pattern of each color) respectively shown in FIGS. 20A and 20B, that is, the peak positions indicate peak frequencies. The intensities of the two-dimensional Fourier spectra at the peak positions indicate peak intensities.

Here, the peak frequencies and the peak intensities of the spectrum peaks of the combined wiring pattern and each sub-pixel array pattern of the BM pattern 38 are calculated and acquired in a manner similar to that of the following description. Hereinafter, summary thereof will be described. In addition, hereinafter, the luminance data of the BM pattern 38 (the sub-pixel array pattern of each color) at the time of lighting on for each color is simply referred to as each sub-pixel array pattern of the BM pattern 38 represented as the luminance data. The transmittance image data of the combined wiring pattern is simply referred to as the combined wiring pattern represented as the transmittance image data.

Figure 21:
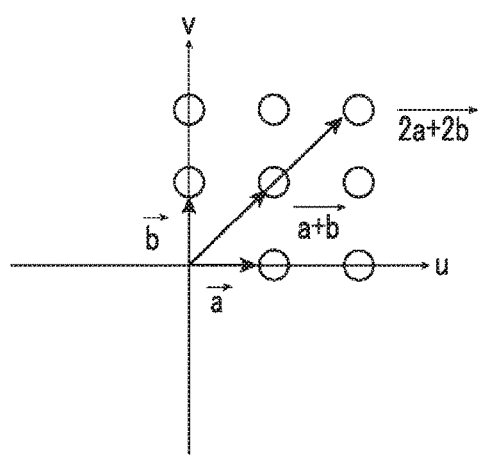
FIG. 21 is a graph illustrating a frequency peak position of the pixel array pattern of the display unit shown in FIG. 15A1.

First, for peak calculation, the frequency peaks are obtained from basic frequencies of the combined wiring pattern and the sub-pixel array patterns of the BM pattern 38. The reason for this is that, since the luminance image data and the transmittance image data for performing the 2DFFT processing are discrete values, the peak frequency depends on an inverse of the image size. As shown in FIG. 21, each frequency peak position can be represented by combination based on a bar and b bar as independent two-dimensional fundamental frequency vector components. Consequently, it is apparent that the obtained peak positions have a lattice shape.

Figure 22:
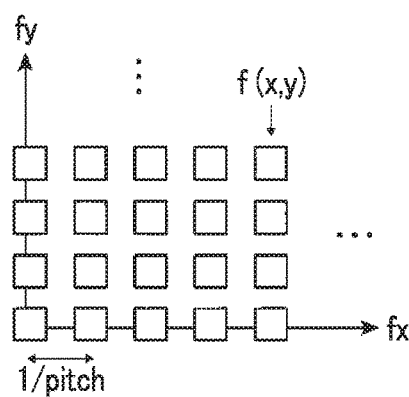
FIG. 22 is a graph illustrating a frequency peak position of an input pattern image.

That is, as shown in FIG. 22, the positions of the spectrum peaks of the combined wiring pattern and the sub-pixel array patterns of the BM pattern 38 on the frequency coordinates fxfy, that is, the peak positions are given as positions of points having a lattice shape on the frequency coordinates fxfy in which an inverse (lip (pitch)) of the pattern pitch is set as a lattice interval.

In addition, FIG. 21 is a graph illustrating the frequency peak positions in the case of the sub-pixel array pattern of the G color in the BM pattern 38 at the time of emitting G-color light, and the frequency peak positions in a case of the combined wiring pattern can also be obtained in a manner similar to that in the above description.

In contrast, in the process of acquiring the peak intensities, the peak positions are obtained by acquiring the peak frequencies, and thus the intensities (absolute values) of the two-dimensional Fourier spectra at the peak positions are obtained.

Here, it is preferable that the obtained peak intensity is normalized by the image area (image size). For example, it is preferable that the intensity is normalized by the above-mentioned image size (Parseval's theorem).

Next, in process 4, a spatial frequency and an intensity of noise are calculated from the peak frequencies and the peak intensities of the transmittance image data of the combined wiring pattern and the peak frequencies and the peak intensities of the luminance data of the BM pattern 38 at the time of lighting on for each color of RGB obtained in process 3 (step S14).

Specifically, as shown in FIG. 16, in step S16, the frequencies and the intensities of noises for respective colors are calculated from the peak frequencies and the peak intensities of both two-dimensional Fourier spectra of the mesh pattern and the sub-pixel array patterns of the respective RGB colors of the BM pattern 38 respectively calculated in step S14. Here, the peak intensities and the intensities of noises are also treated as absolute values.

Here, spatial frequencies and intensities of noises can be calculated through a convolution operation of the peak frequencies and the peak intensities of the sub-pixel array patterns of the respective RGB colors of the peak frequency and the peak intensity of the mesh pattern 24.

In real space, noise is caused by multiplication of the image data pieces (the transmittance image data and the luminance image data) of the combined wiring pattern of the conductive film 10 and the sub-pixel array pattern of the BM pattern 38 at the time of lighting on for each color. Thus, in frequency space, both image data pieces are subjected to convolution integration (convolution). However, in steps S14 and S16, the peak frequencies and the peak intensities of both two-dimensional Fourier spectra of the combined wiring pattern and the sub-pixel array pattern of each color of the BM pattern 38 are calculated. Therefore, a difference (an absolute value of a difference) between both frequency peaks of the combined wiring pattern and the sub-pixel array pattern of a single color of RGB is obtained, the obtained difference is set as a frequency of noise, a product between two sets of vector intensities obtained by combining both is obtained, and the obtained product is set as an intensity (absolute value) of noise.

The frequency of noise and the intensity of noise are obtained for each color of RGB.

Here, the difference between the frequency peaks of the intensity characteristics of both two-dimensional Fourier spectra of the combined wiring pattern and the sub-pixel array pattern of each color of the BM pattern 38 respectively shown in FIGS. 20A and 20B corresponds to a relative distance between the peak positions of both frequency peaks on the frequency coordinates, in intensity characteristics obtained by superimposing the intensity characteristics of both two-dimensional Fourier spectra for each color.

A plurality of spectrum peaks of both two-dimensional Fourier spectra between the combined wiring pattern and the sub-pixel array pattern of each color of the BM pattern 38 is present for each color. Therefore, a plurality of the differences between the frequency peaks which are values of the relative distances, that is, a plurality of the frequencies of noise is obtained. Consequently, if there are multiple spectrum peaks of both two-dimensional Fourier spectra, there are multiple obtained frequencies of noise, and thus there are multiple obtained intensities of noise.

However, in a case where the intensities of noise at the obtained frequencies of noise are weak, noise is not visually perceived. Thus, it is preferable to deal with only noise of which the intensity of noise is regarded to be weak and is equal to or greater than a predetermined value, for example, noise of which the intensity is equal to or greater than −4.5.

Here, in the display device, the display resolution is determined, thus the highest frequency, at which display can be performed on the display device, is determined depending on the resolution thereof. Hence, noise having a frequency higher than the highest frequency is not displayed on the display device, and therefore it is not necessary to set the noise as an evaluation target in the present invention. Accordingly, the highest frequency of noise can be defined in accordance with the display resolution. Here, the highest frequency of noise, which has to be considered in the present invention, can be set to 1000/Pd (cycle/mm) when the pixel pitch of the pixel array pattern of the display is Pd (μm).

From the above description, in the present invention, in the frequencies and the intensities of noise obtained from the spectrum peaks of both two-dimensional Fourier spectra, noise as the evaluation (quantification) target in the present invention is noise, of which a frequency is equal to or less than the highest frequency of noise of 1000/Pd (for example, 10 cycle/mm in the present example), for example, 8 cycle/mm defined in accordance with the target display resolution (for example, 264 dpi in the present example) and noise of which an intensity of noise is equal to or greater than −4.5. In the present invention, the reason why noise having the intensity of noise equal to or greater than −4.5 is set as a target is as follows. If multiple noises of which the intensity is less than −4.5 occur and thus the sum thereof is used, even originally invisible noise may have to be scored. For this reason, in the present invention, a threshold value, which is equal to or greater than −4.5, is provided from an empirical visibility limit.

Next, in process 5, noise is quantified using the frequency and the intensity of noise for each sub-pixel of each color of RGB calculated in process 4 (step S16), and a quantitative value as an indicator of evaluation of noise is obtained.

That is, as shown in FIG. 16, in step S18, convolution of the visual transfer function (VTF) (the VTF is set to 1.0 in a low frequency region less than a frequency at which the VTF has the maximum value, but the 0 frequency component is set to 0) and the spectrum peaks for noise evaluation remaining in step S16 is performed, and quantified.

In the quantification of noise, specifically, in step S18, in the frequencies and the intensities (absolute values) of noises for the sub-pixels of the respective colors of RGB obtained in step S16, a plurality of evaluation values of noises of the respective colors is calculated by applying human visual response characteristics (VTF) corresponding to the observation distance of 750 mm as an example of human visual response characteristics represented by the following Expression (1), that is, by performing convolution integration. Here, in order to score noise, the VTF corresponding to the observation distance of 750 mm is used.

$$\text{VTF}=5.05e^{-0.138k}(1-e^{0.1k}) \tag{1}$$

$$k=\pi du/180$$

Here, k is a spatial frequency (cycle/deg) defined by a solid angle, u shown in the above-mentioned Expression (1) is a spatial frequency (cycle/mm) defined by a length, and d is defined by an observation distance (mm).

The visual transfer function represented in the above-mentioned Expression (1) is called a Dooley-Shaw function, and is obtained with reference to description of a reference (R. P. Dooley, R. Shaw: Noise Perception in Electrophotography, J. Appl. Photogr. Eng., 5, 4 (1979), pp. 190-196.).

In such a manner, it is possible to obtain the evaluation value of noise using a common logarithm of the intensity for each color of RGB.

Here, the above-mentioned steps S10 to S18 are repeated for each color of RGB, and the evaluation values of noises of RGB may be obtained. However, in each step of the above-mentioned steps S10 to S18, the calculation may be performed for each color of RGB.

A worst value, that is, a maximum value among the evaluation values of noises of RGB obtained in such a manner is set as the indicator of evaluation (quantitative value) of noise. A value of the indicator of evaluation of noises is obtained as a value (common logarithm value) of a common logarithm of the indicator of evaluation of noises represented by a common logarithm is obtained. It is preferable that evaluation is also performed by combining an evaluation image with RGB display in accordance with calculation of the worst value.

It can be said that the quantitative value of noise, which is the indicator of evaluation of noise, is a value of quantification of moiré and noise in the related art. In the present invention, noise is defined as a state in which a lot of moirés are present. Accordingly, in the present invention, if there is a peak in a single frequency, it is determined that moiré is present. In contrast, if there is a plurality of peaks in the vicinity of a single frequency, it is determined that noise is present.

The above-mentioned indicator of evaluation of noise is obtained in a case where the conductive film 10 laminated on the display screen of the display unit 30 of the display 40 is observed from the front of the display screen. However, the present invention is not limited to this, and the indicator of evaluation of noise in a case where observation is performed in a direction oblique to the front may be obtained.

In the case where the indicator of evaluation of noise is obtained in a case where observation is performed in a direction oblique to the front, the intensities of RGB of the display 40 at the time of oblique observation are calculated at 90% of the luminance at the time of front observation, the process returns to step S14, and the peak frequencies and the peak intensities of the Fourier spectra of the respective colors are calculated again. Thereafter, steps S16 to S18 are repeated in a similar manner, and the indicator of evaluation of noise at the time of oblique observation is calculated.

In such a manner, if the indicators of evaluation of noise are calculated at the time of front observation and oblique observation, a large value (worst value) among the indicators of evaluation of noise at the time of front observation and oblique observation is calculated as the indicator of evaluation of noise to be provided for noise evaluation.

In a case where only one of the front observation and the oblique observation is not performed, the indicator of evaluation of noise at the front observation or the oblique observation is set as the indicator of evaluation of noise to be directly provided for noise evaluation.

Next, in process 6, the combined wiring pattern and the random mesh pattern are evaluated and determined on the basis of the indicator of evaluation (quantitative value: worst value) of noise calculated in process 5 (step S16).

That is, as shown in FIG. 16, in step S20, if a common logarithm value of the indicator of evaluation of noise of the current combined wiring pattern obtained in step S18 is equal to or less than a predetermined evaluation threshold value, it is evaluated that each of the random mesh patterns constituting the current combined wiring pattern, a random mesh pattern on one side corresponding to the other wiring pattern, or a random mesh pattern on the other side as the transparent conductive layer is an optimized random mesh pattern applied to the conductive film 10 of the present invention, and the random mesh pattern is set as a random mesh pattern 25a optimized as shown in FIG. 2.

The reason why the value of the indicator of evaluation of noise is limited to be equal to or less than the predetermined evaluation threshold value as a common logarithm is as follows. If the value is greater than the predetermined evaluation threshold value, noise, which is caused by interference between each sub-pixel array pattern of the BM pattern and the combined wiring pattern overlapping with each other, is visually perceived, and the visually perceived noise offers a sense of discomfort to a user who observes the noise. In a case where the value of the indicator of evaluation of noise is equal to or less than the predetermined evaluation threshold value, the noise may slightly offer a sense of discomfort, but does not matter.

Here, the predetermined evaluation threshold value is appropriately set in accordance with shapes and properties of the conductive film and the display device. Specifically, the shapes and properties includes a line width of the thin metal line 14 of the random mesh pattern 25a, a shape, an angle, and a size (such a pitch) of the cell (opening portion 22), a phase angle (a rotation angle, and a deviation angle) of the wiring pattern of two wiring layers 28, a shape, a size (such a pitch), and arrangement and an angle of the BM pattern 38, and the like. However, for example, the predetermined value is preferably equal to or less than $-2.80$ ($10^{-2.80}$ as an antilogarithm) as a common logarithm. That is, for example, the indicator of evaluation of noise is preferably equal to or less than $-2.80$ ($10^{-2.80}$ as an antilogarithm) as a common logarithm.

Although described in detail later, the indicator of evaluation of noise is obtained for each of the multiple combined wiring patterns, each of which is formed by overlapping various random mesh patterns 25a, by using simulation samples and real samples. Three functional evaluators perform functional evaluation on noise, which is caused by interference between the sub-pixel array pattern of each color of three colors such as RGB of the BM pattern and the combined wiring pattern, with their own eyes. If the indicator of evaluation of noise is equal to or less than $-2.80$ as a common logarithm, in a state where the display is lit on, in terms of visibility of noise which is caused by interference between the sub-pixel array pattern of each color of three colors such as RGB of the BM pattern and the combined wiring pattern overlapping each other, a level of the noise is better than a level of noise which does not matter even when recognized as deterioration.

Consequently, in the combined wiring pattern optimized in the present invention and the random mesh patterns 25a as components thereof, the indicator of evaluation of noise is preferably specified to be equal to or less than $-2.80$ ($10^{-2.80}$ as an antilogarithm) as a common logarithm.

It is apparent that a plurality of optimized random mesh patterns 25a is obtained in accordance with the line width of the thin metal line 14 of the random mesh pattern 25a, the shape of the opening portion 22, the size (pitch and angle), an overlapped state of the random mesh patterns 25a of two wiring layers, and the like. Here, a random mesh pattern 25a having a small common logarithm value of the indicator of evaluation of noise may be a best random mesh pattern 25a, and the plurality of optimized random mesh patterns 25a may be prioritized.

The random mesh pattern 25a, which is evaluated in such a manner and is shown in FIG. 2, is determined and evaluated as a wiring pattern of the conductive film of the present invention.

In such a manner, the method of determining the wiring patterns on the conductive film of the present invention is terminated, and the evaluated random mesh patterns can be evaluated as wiring patterns on the conductive film of the present invention.

As a result, the BM pattern of the display unit of the display device in a state of lighting on is superposed such that occurrence of noise is suppressed. Thus, also for the display device with a different resolution, it is possible to provide the conductive film of the present invention which is excellent in visibility of noise regardless of the observation distance and has the optimized random mesh pattern.

In the present invention, the optimized random mesh pattern, which is optimized with respect to the predetermined BM pattern, is used. Therefore, occurrence of noise is further suppressed, and image quality becomes further excellent in terms of visibility of noise. Even in a case where the BM patterns overlapping each other slightly change, it is possible to suppress occurrence of noise, and it is possible to maintain excellent performance in terms of visibility of noise.

Hereinbefore, the conductive film according to the present invention, the display device comprising the conductive film, and the method of evaluating the patterns of the conductive film have been described with reference to various embodiments and examples. However, it is apparent that the present invention is not limited to the embodiments and the examples and may be improved or modified in various forms without departing from the scope of the present invention.

EXAMPLES

Hereinafter, the present invention will be described in detail on the basis of examples.

Example I

In the present example, in accordance with the flow of the method of evaluating the conductive film of the present invention shown in FIGS. 16 and 17, in a manner similar to the above description, an experiment was performed as follows.

In the pixel array (BM) patterns 38 of the display of Nos. 1 to 16 that have different resolutions, emission intensities, and sub-pixel shapes typified by the G sub-pixel array patterns shown in FIGS. 15A1 to 15H2, multiple random mesh patterns 25a that have random mesh pattern shapes formed of the Voronoi polygons shown in FIG. 2, have the different shapes and sizes (average pitches) of the opening portions, and have different line widths of the thin metal lines (mesh) are provided as simulation samples, and the combined wiring pattern and the BM pattern of each color overlap with each other. Then, the indicator of evaluation of noise was obtained, the multiple random mesh patterns, which are made to be random in different manners, overlap with the BM patterns of respective colors, and the three functional evaluators performed functional evaluation on noise, which is caused by interference between both overlapping patterns in a simulation image of noise, with their eyes.

Results thereof are shown in Tables 1-1 to 1-3.

Here, as shown in FIG. 16, regarding evaluation of noise, functional evaluation was performed in the following manner: the transmittance image data of the combined wiring pattern was superposed on the luminance image data of the sub-pixel array pattern of each color of the pixel array (BM) pattern used in step S14; a simulation image of noise, in which a transmittance image is superposed on a luminance image, was created, and was displayed on the display; and the three functional evaluators observed the displayed simulation image.

Here, the functional evaluation results were obtained in the following manner. The noise is evaluated on 5 levels of 1 to 5. In a case where deterioration of visibility of noise is observed and offers a strong sense of discomfort, the evaluation level is set to 1. In a case where deterioration of visibility of noise is observed and offers a sense of discomfort, the evaluation level is set to 2. In a case where deterioration of visibility of noise is observed and offers a weak sense of discomfort, the evaluation level is set to 3. In a case where deterioration of visibility of noise is observed but does not offer a sense of discomfort, the evaluation level is set to 4. In a case where deterioration of visibility of noise is not observed, the evaluation level is set to 5.

In terms of visibility of noise, noise is allowable if the evaluation level is equal to or greater than 4. However, it is preferable that the evaluation level is 5.

In the present example, the average pitch of the cells (opening portions 22) of the random mesh pattern 25a was changed to 50 μm, 100 μm, 200 μm, and 300 μm.

Further, the line width of the random mesh pattern 25a was changed to 2 μm and 4 μm.

In addition, the resolutions of the display using 8 types of the BM patterns having different BM structures of Nos. 1 to 16 shown in FIGS. 15A1 to 15H2 respectively were 149 dpi in Nos. 1 and 2, 222 dpi in Nos. 3 and 4, 265 dpi in Nos. 5 to 8, 326 dpi in Nos. 9 and 10, 384 dpi in Nos. 11 to 14, and 440 dpi in Nos. 15 and 16.

Furthermore, the emission intensity of the display was normalized by the display LP101WX1 (SL) (n3) (manufactured by LG Display Corp.). When the entire range of the intensity was given as a range of 0 to 255, even in any display, the emission intensity was changed to 64 (luminance 1) in Nos. 1, 3, 5, 6, 9, 11, 12, and 15, and 128 (luminance 2) in Nos. 2, 4, 7, 8, 10, 13, 14, and 16.

For imaging the sub-pixel array pattern of each color of the pixel array (BM) pattern 38, STM6 (manufactured by OLYMPUS Corp.) was used as the microscope, UMPlanFI10x (manufactured by OLYMPUS Corp.) was used as the lens, and QIC-F-CLR-12-C (manufactured by QIMAGING Corp.) was used as the camera. Here, as the imaging conditions, for experiment example, a gain was set to 1.0, and white balance (G, R, B) was set to (1.00, 2.17, 1.12). Further, the captured image was subjected to shading correction.

For measuring luminance, a USB2000+ manufactured by Ocean Optics and a diffuser plate (CC-3-UV-S manufactured by the same company) at the tip of the fiber were used, and the integration time period was set to 250 ms.

Calculation of the indicator of evaluation of noise was performed as described above in the method shown in FIG. 16.

TABLE 1

Table 1-1

| | BM No | Pixel Size [μm] | Average Pitch [μm] | Line Width [μm] | Quantitative Value | Functional Evaluation Result |
|---|---|---|---|---|---|---|
| Example 1 | 15 | 57 | 300 | 4 | NaN | 5 |
| Example 2 | 5 | 96 | 300 | 2 | NaN | 5 |
| Example 3 | 9 | 78 | 200 | 2 | NaN | 5 |
| Example 4 | 9 | 78 | 300 | 2 | NaN | 5 |
| Example 5 | 10 | 78 | 200 | 2 | NaN | 5 |
| Example 6 | 10 | 78 | 300 | 2 | NaN | 5 |
| Example 7 | 12 | 66 | 200 | 2 | NaN | 5 |
| Example 8 | 12 | 66 | 300 | 2 | NaN | 5 |
| Example 9 | 14 | 66 | 200 | 2 | NaN | 5 |
| Example 10 | 14 | 66 | 300 | 2 | NaN | 5 |
| Example 11 | 15 | 57 | 200 | 2 | NaN | 5 |

TABLE 1

Table 1-1

|  | BM No | Pixel Size [μm] | Average Pitch [μm] | Line Width [μm] | Quantitative Value | Functional Evaluation Result |
|---|---|---|---|---|---|---|
| Example 12 | 15 | 57 | 300 | 2 | NaN | 5 |
| Example 13 | 16 | 57 | 300 | 2 | NaN | 5 |
| Example 14 | 7 | 96 | 300 | 2 | −9.7 | 4 |
| Example 15 | 6 | 96 | 300 | 2 | −9.5 | 4 |
| Example 16 | 8 | 96 | 300 | 2 | −9.2 | 4 |
| Example 17 | 11 | 66 | 300 | 2 | −9.0 | 4 |
| Example 18 | 13 | 66 | 300 | 2 | −8.7 | 4 |
| Example 19 | 3 | 114 | 300 | 2 | −8.4 | 4 |
| Example 20 | 5 | 96 | 200 | 2 | −8.1 | 4 |
| Example 21 | 4 | 114 | 300 | 2 | −8.1 | 4 |
| Example 22 | 6 | 96 | 200 | 2 | −8.0 | 4 |
| Example 23 | 12 | 66 | 300 | 4 | −7.8 | 4 |
| Example 24 | 7 | 96 | 200 | 2 | −7.8 | 4 |
| Example 25 | 8 | 96 | 200 | 2 | −7.7 | 4 |
| Example 26 | 14 | 66 | 300 | 4 | −7.5 | 4 |
| Example 27 | 16 | 57 | 200 | 2 | −7.3 | 4 |
| Example 28 | 3 | 114 | 200 | 2 | −6.9 | 4 |
| Example 29 | 4 | 114 | 200 | 2 | −6.6 | 4 |
| Example 30 | 15 | 57 | 100 | 2 | −6.2 | 4 |
| Example 31 | 9 | 78 | 300 | 4 | −5.9 | 4 |
| Example 32 | 1 | 170 | 300 | 2 | −5.9 | 4 |
| Example 33 | 11 | 66 | 200 | 2 | −5.8 | 4 |
| Example 34 | 10 | 78 | 300 | 4 | −5.6 | 4 |
| Example 35 | 2 | 170 | 300 | 2 | −5.6 | 4 |
| Example 36 | 13 | 66 | 200 | 2 | −5.5 | 4 |
| Example 37 | 15 | 57 | 200 | 4 | −5.1 | 4 |
| Example 38 | 5 | 96 | 300 | 4 | −4.9 | 4 |
| Example 39 | 12 | 66 | 100 | 2 | −4.9 | 4 |
| Example 40 | 14 | 66 | 100 | 2 | −4.6 | 4 |
| Example 41 | 7 | 96 | 300 | 4 | −4.4 | 4 |
| Example 42 | 6 | 96 | 300 | 4 | −4.2 | 4 |
| Example 43 | 12 | 66 | 200 | 4 | −4.2 | 4 |
| Example 44 | 16 | 57 | 300 | 4 | −4.1 | 4 |
| Example 45 | 1 | 170 | 200 | 2 | −4.0 | 4 |
| Example 46 | 8 | 96 | 300 | 4 | −3.9 | 4 |
| Example 47 | 11 | 66 | 300 | 4 | −3.9 | 4 |
| Example 48 | 14 | 66 | 200 | 4 | −3.9 | 4 |
| Example 49 | 2 | 170 | 200 | 2 | −3.7 | 4 |
| Example 50 | 9 | 78 | 200 | 4 | −3.7 | 4 |

TABLE 2

Table 1-2

|  | BM No | Pixel Size [μm] | Average Pitch [μm] | Line Width [μm] | Quantitative Value | Functional Evaluation Result |
|---|---|---|---|---|---|---|
| Example 51 | 3 | 114 | 300 | 4 | −3.6 | 4 |
| Example 52 | 13 | 66 | 300 | 4 | −3.6 | 4 |
| Example 53 | 16 | 57 | 200 | 4 | −3.5 | 4 |
| Example 54 | 16 | 57 | 100 | 2 | −3.5 | 4 |
| Example 55 | 6 | 96 | 50 | 2 | −3.4 | 4 |
| Example 56 | 10 | 78 | 200 | 4 | −3.4 | 4 |
| Example 57 | 4 | 114 | 300 | 4 | −3.3 | 4 |
| Example 58 | 5 | 96 | 200 | 4 | −3.1 | 4 |
| Example 59 | 11 | 66 | 50 | 2 | −3.1 | 4 |
| Example 60 | 12 | 66 | 50 | 2 | −3.1 | 4 |
| Example 61 | 11 | 66 | 200 | 4 | −3.1 | 4 |
| Example 62 | 3 | 114 | 50 | 2 | −3.1 | 4 |
| Example 63 | 6 | 96 | 200 | 4 | −3.0 | 4 |
| Example 64 | 9 | 78 | 100 | 2 | −3.0 | 4 |
| Example 65 | 8 | 96 | 50 | 2 | −3.0 | 4 |
| Example 66 | 5 | 96 | 50 | 2 | −3.0 | 4 |
| Example 67 | 1 | 170 | 50 | 2 | −2.9 | 4 |
| Example 68 | 13 | 66 | 50 | 2 | −2.8 | 4 |
| Example 69 | 14 | 66 | 50 | 2 | −2.8 | 4 |
| Example 70 | 7 | 96 | 200 | 4 | −2.8 | 4 |
| Example 71 | 15 | 57 | 50 | 2 | −2.8 | 4 |
| Example 72 | 9 | 78 | 50 | 2 | −2.8 | 4 |
| Example 73 | 13 | 66 | 200 | 4 | −2.8 | 4 |
| Comparative Example 1 | 8 | 96 | 200 | 4 | −2.7 | 3 |
| Comparative Example 2 | 10 | 78 | 100 | 2 | −2.7 | 3 |
| Comparative Example 3 | 12 | 66 | 100 | 4 | −2.7 | 3 |
| Comparative Example 4 | 7 | 96 | 50 | 2 | −2.6 | 3 |
| Comparative Example 5 | 1 | 170 | 100 | 2 | −2.6 | 3 |
| Comparative Example 6 | 4 | 114 | 50 | 2 | −2.5 | 3 |
| Comparative Example 7 | 15 | 57 | 100 | 4 | −2.5 | 3 |
| Comparative Example 8 | 11 | 66 | 100 | 2 | −2.5 | 3 |
| Comparative Example 9 | 10 | 78 | 50 | 2 | −2.5 | 3 |
| Comparative Example 10 | 5 | 96 | 100 | 2 | −2.4 | 3 |
| Comparative Example 11 | 2 | 170 | 50 | 2 | −2.4 | 3 |
| Comparative Example 12 | 6 | 96 | 100 | 2 | −2.4 | 3 |
| Comparative Example 13 | 3 | 114 | 100 | 2 | −2.4 | 3 |
| Comparative Example 14 | 14 | 66 | 100 | 4 | −2.4 | 3 |
| Comparative Example 15 | 16 | 57 | 50 | 2 | −2.3 | 3 |
| Comparative Example 16 | 2 | 170 | 100 | 2 | −2.3 | 3 |
| Comparative Example 17 | 13 | 66 | 100 | 2 | −2.2 | 3 |
| Comparative Example 18 | 8 | 96 | 100 | 2 | −2.1 | 3 |
| Comparative Example 19 | 4 | 114 | 100 | 2 | −2.1 | 3 |
| Comparative Example 20 | 1 | 170 | 300 | 4 | −2.1 | 3 |

TABLE 3

Table 1-3

|  | BM No | Pixel Size [μm] | Average Pitch [μm] | Line Width [μm] | Quantitative Value | Functional Evaluation Result |
|---|---|---|---|---|---|---|
| Comparative Example 21 | 7 | 96 | 100 | 2 | −2.1 | 3 |
| Comparative Example 22 | 3 | 114 | 200 | 4 | −2.0 | 3 |
| Comparative Example 23 | 2 | 170 | 300 | 4 | −1.8 | 3 |
| Comparative Example 24 | 4 | 114 | 200 | 4 | −1.7 | 3 |
| Comparative Example 25 | 16 | 57 | 100 | 4 | −1.7 | 3 |
| Comparative Example 26 | 6 | 96 | 50 | 4 | −1.7 | 3 |
| Comparative Example 27 | 3 | 114 | 50 | 4 | −1.6 | 2 |
| Comparative Example 28 | 5 | 96 | 50 | 4 | −1.6 | 2 |
| Comparative Example 29 | 12 | 66 | 50 | 4 | −1.5 | 2 |
| Comparative Example 30 | 1 | 170 | 50 | 4 | −1.5 | 2 |
| Comparative Example 31 | 9 | 78 | 100 | 4 | −1.5 | 2 |

TABLE 3-continued

Table 1-3

| | BM No | Pixel Size [μm] | Average Pitch [μm] | Line Width [μm] | Quantitative Value | Functional Evaluation Result |
|---|---|---|---|---|---|---|
| Comparative Example 32 | 1 | 170 | 200 | 4 | −1.5 | 2 |
| Comparative Example 33 | 11 | 66 | 50 | 4 | −1.4 | 2 |
| Comparative Example 34 | 9 | 78 | 50 | 4 | −1.3 | 2 |
| Comparative Example 35 | 6 | 96 | 100 | 4 | −1.3 | 2 |
| Comparative Example 36 | 15 | 57 | 50 | 4 | −1.3 | 2 |
| Comparative Example 37 | 1 | 170 | 100 | 4 | −1.3 | 2 |
| Comparative Example 38 | 11 | 66 | 100 | 4 | −1.2 | 2 |
| Comparative Example 39 | 5 | 96 | 100 | 4 | −1.2 | 2 |
| Comparative Example 40 | 14 | 66 | 50 | 4 | −1.2 | 2 |
| Comparative Example 41 | 8 | 96 | 50 | 4 | −1.2 | 2 |
| Comparative Example 42 | 3 | 114 | 100 | 4 | −1.2 | 2 |
| Comparative Example 43 | 10 | 78 | 100 | 4 | −1.2 | 2 |
| Comparative Example 44 | 7 | 96 | 50 | 4 | −1.2 | 2 |
| Comparative Example 45 | 4 | 114 | 50 | 4 | −1.2 | 2 |
| Comparative Example 46 | 2 | 170 | 200 | 4 | −1.2 | 2 |
| Comparative Example 47 | 13 | 66 | 50 | 4 | −1.1 | 2 |
| Comparative Example 48 | 10 | 78 | 50 | 4 | −1.0 | 1 |
| Comparative Example 49 | 2 | 170 | 50 | 4 | −1.0 | 1 |
| Comparative Example 50 | 8 | 96 | 100 | 4 | −1.0 | 1 |
| Comparative Example 51 | 13 | 66 | 100 | 4 | −0.9 | 1 |
| Comparative Example 52 | 2 | 170 | 100 | 4 | −0.9 | 1 |
| Comparative Example 53 | 16 | 57 | 50 | 4 | −0.9 | 1 |
| Comparative Example 54 | 7 | 96 | 100 | 4 | −0.9 | 1 |
| Comparative Example 55 | 4 | 114 | 100 | 4 | −0.9 | 1 |

It should be noted that, in Table 1-1, "NaN" in items of quantitative values of noise means that since an intensity is small and elements which do not contribute to occurrence of noise are removed through threshold processing, a quantitative value of noise is not obtained, noise does not occur, and noise is not visually perceived.

In Examples 1 to 73 shown in Tables 1-1 and 1-2, the indicators of evaluation (evaluation values) thereof were equal to or less than −2.80, and all evaluation results of visibility were equal to or greater than 4. The above-mentioned examples are examples of the present invention.

It should be noted that, in Examples 1 to 13 shown in Table 1-1 as "NaN" in the items of the quantitative values of noise, all evaluation results of visibility were 5. It would appear that there was no occurrence of noise and noise was not visually perceived.

In contrast, in Comparative Examples 1 to 55 shown in Tables 1-2 and 1-3, the indicators of evaluation (evaluation values) were greater than −2.80, and the evaluation results were equal to or less than 3. It would appear that noise, which was likely to offer a sense of discomfort, was visually perceived.

Example II

In the present example, instead of the multiple random mesh patterns 25a that have random mesh pattern shapes such as Voronoi polygons or Delaunay triangles used in Example I as shown in FIG. 2, the random mesh patterns 25b, 25c, 25d, and 25e having anisotropy are used, where the base figures of the patterns are for example rhomboids, hexagons, and parallelograms as shown in FIGS. 23, 25A, 25B, and 25C, and the opening centroids of the opening portions 22 are made to vary (randomized) by 5% as a average value. In exactly the same manner as that of Example I, the patterns are provided as simulation samples, and the combined wiring pattern and the BM pattern of each color overlap with each other. Then, the indicator of evaluation of noise was obtained, the multiple random mesh patterns, which are made to be random in different manners, overlap with the BM patterns of respective colors, and the three functional evaluators performed functional evaluation on noise, which is caused by interference between both overlapping patterns in a simulation image of noise, with their eyes.

Results thereof are shown in Table 2.

In the present Example II, the inclination angles of the oblique sides of a polygon as a base figure constituting each cell (opening portion 22) of the random mesh patterns 25b, 25c, 25d, and 25e were changed to 30°, 35°, and 40°.

Further, the average pitches of the cells (opening portions 22) of the random mesh patterns 25b, 25c, 25d, and 25e were changed to 50 μm, 100 μm, 200 μm, 300 μm, and 400 μm.

Furthermore, the line widths of the random mesh patterns 25b, 25c, 25d, and 25e were changed to 2 μm and 4 μm.

In addition, the image resolutions thereof were changed to 6350 dpi and 12700 dpi.

TABLE 4

Table 2

| | BM No. | Base Figure | Inclination angle [°] | Average Pitch [μm] | Line Width [μm] | Resolution [dpi] | Quantitative Value | Functional Evaluation Result |
|---|---|---|---|---|---|---|---|---|
| Example 80 | 3 | Parallelogram | Oblique side angle 35° | 100 | 4 | 6350 | −3.0 | 4 |
| Example 81 | 4 | Rhomboid | Oblique side angle 30° | 50 | 2 | 12700 | −3.0 | 4 |
| Example 82 | 7 | Hexagon | Oblique side angle 30° | 300 | 4 | 6350 | −3.0 | 4 |

TABLE 4-continued

Table 2

| | BM No. | Base Figure | Inclination angle [°] | Average Pitch [μm] | Line Width [μm] | Resolution [dpi] | Quantitative Value | Functional Evaluation Result |
|---|---|---|---|---|---|---|---|---|
| Example 83 | 4 | Rhomboid | Oblique side angle 35° | 200 | 4 | 6350 | −3.0 | 4 |
| Example 84 | 1 | Parallelogram | Oblique side angle 35° | 200 | 2 | 12700 | −2.9 | 4 |
| Example 85 | 4 | Parallelogram | Oblique side angle 35° | 100 | 2 | 12700 | −2.9 | 4 |
| Example 86 | 2 | Rhomboid | Oblique side angle 35° | 200 | 2 | 12700 | −2.9 | 4 |
| Example 87 | 1 | Rhomboid | Oblique side angle 35° | 150 | 2 | 12700 | −2.9 | 4 |
| Example 88 | 7 | Hexagon | Oblique side angle 30° | 150 | 2 | 12700 | −2.9 | 4 |
| Example 89 | 1 | Rhomboid | Oblique side angle 40° | 200 | 4 | 6350 | −2.9 | 4 |
| Example 90 | 1 | Rhomboid | Oblique side angle 30° | 150 | 2 | 12700 | −2.9 | 4 |
| Example 91 | 4 | Rhomboid | Oblique side angle 30° | 150 | 2 | 12700 | −2.8 | 4 |
| Example 92 | 8 | Hexagon | Oblique side angle 30° | 150 | 2 | 12700 | −2.8 | 4 |
| Example 93 | 13 | Hexagon | Oblique side angle 30° | 300 | 4 | 6350 | −2.8 | 4 |
| Example 94 | 1 | Rhomboid | Oblique side angle 40° | 300 | 4 | 6350 | −2.8 | 4 |
| Example 95 | 1 | Rhomboid | Oblique side angle 30° | 300 | 4 | 6350 | −2.8 | 4 |
| Example 96 | 4 | Rhomboid | Oblique side angle 30° | 300 | 4 | 6350 | −2.8 | 4 |
| Example 97 | 1 | Rhomboid | Oblique side angle 40° | 150 | 2 | 12700 | −2.8 | 4 |
| Comparative Example 60 | 3 | Parallelogram | Oblique side angle 40° | 100 | 4 | 6350 | −2.7 | 3 |
| Comparative Example 61 | 13 | Hexagon | Oblique side angle 30° | 150 | 2 | 12700 | −2.7 | 3 |
| Comparative Example 62 | 1 | Parallelogram | Oblique side angle 30° | 200 | 2 | 12700 | −2.7 | 3 |
| Comparative Example 63 | 1 | Rhomboid | Oblique side angle 35° | 300 | 4 | 6350 | −2.7 | 3 |
| Comparative Example 64 | 1 | Rhomboid | Oblique side angle 35° | 400 | 4 | 6350 | −2.7 | 3 |
| Comparative Example 65 | 2 | Rhomboid | Oblique side angle 30° | 200 | 2 | 12700 | −2.7 | 3 |
| Comparative Example 66 | 4 | Parallelogram | Oblique side angle 40° | 100 | 2 | 12700 | −2.7 | 3 |
| Comparative Example 67 | 3 | Rhomboid | Oblique side angle 30° | 100 | 4 | 6350 | −2.7 | 3 |
| Comparative Example 68 | 3 | Rhomboid | Oblique side angle 40° | 100 | 4 | 6350 | −2.7 | 3 |
| Comparative Example 69 | 1 | Parallelogram | Oblique side angle 40° | 200 | 4 | 6350 | −2.6 | 3 |
| Comparative Example 70 | 1 | Parallelogram | Oblique side angle 30° | 400 | 4 | 6350 | −2.6 | 3 |
| Comparative Example 71 | 1 | Hexagon | Oblique side angle 30° | 50 | 2 | 12700 | −2.6 | 3 |
| Comparative Example 72 | 1 | Parallelogram | Oblique side angle 35° | 200 | 4 | 6350 | −2.6 | 3 |

In Examples 80 to 97 shown in Table 2, the indicators of evaluation (evaluation values) thereof were equal to or less than −2.80, and all evaluation results of visibility were equal to or greater than 4. The above-mentioned examples are examples of the present invention.

In contrast, in Comparative Examples 60 to 72 shown in Table 2, the indicators of evaluation (evaluation values) were greater than −2.80, and the evaluation results were equal to or less than 3. It would appear that noise, which was likely to offer a sense of discomfort, was visually perceived.

From the above description, in the conductive film of the present invention having the combined wiring pattern which includes at least one random mesh pattern and allows the quantitative value (indicator of evaluation) of noise to satisfy the range, even if the cycles and the intensities of the BM patterns of the display, the emission intensity of the display, and the like are different, even at the time of front observation, and even at the time of oblique observation, it is possible to suppress occurrence of noise, and it is possible to greatly improve visibility.

From the above description, effects of the present invention are clarified.

In the present invention, in a manner similar to that of the above-mentioned experiment examples, wiring patterns having various pattern shapes are provided in advance, and thus it is possible to determine the conductive film that has wiring patterns including a random mesh pattern in which the entirety or a part of at least one of the upper and lower wiring patterns constituting the combined wiring pattern optimized in the evaluation method of the present invention is randomized. However, in a case where the indicator of evaluation of noise for the single wiring pattern is greater than a predetermined value, it is possible to determine the conductive film which has the optimized wiring pattern by repeating the following process: transmittance image data of the random mesh pattern is updated to transmittance image data of a new random mesh pattern, transmittance image data of a new combined wiring pattern is created, and the quantitative value (the indicator of evaluation) of noise is obtained by applying the above-mentioned evaluation method of the present invention.

Here, the updated new random mesh pattern may be provided in advance, and may be newly created. It should be noted that, in the case where the pattern is newly created, any one or more of the rotation angle, the pitch, and the pattern width of the transmittance image data of the random mesh pattern may be changed, and the shape and the size of the opening portion of the wiring pattern may be changed. In the present invention, it is apparent that it is necessary for at least one of the combined wiring patterns to employ the random mesh pattern in at least one part thereof.

EXPLANATION OF REFERENCES 10, 11, 11A: conductive film
12: transparent support body
14: thin line made of metal (thin metal line)
16, 16a, 16b: wiring portion
18, 18a, 18b: adhesive layer
20, 20a, 20b: protective layer
21: mesh-shaped wiring
22: opening portion
17, 17a, 17b: electrode portion
24: combined wiring pattern
24a: first (upper) wiring pattern
24b: second (lower) wiring pattern
25a, 25b, 25c, 25d, 25e: random mesh pattern
26: dummy electrode portion
27: regular typical pattern
28, 28a, 28b: wiring layer
30: display unit
32, 32r, 32g, 32b: pixel
34: black matrix (BM)
38: BM pattern
40: display device
44: touch panel

What is claimed is:

1. A conductive film that is provided on a display unit of a display device, the conductive film comprising:
a transparent substrate; and
two wiring portions that are formed on both sides or a single side of the transparent substrate,
wherein at least one wiring portion of the two wiring portions has a plurality of thin metal lines,
wherein the plurality of thin metal lines has a polygonal wiring pattern formed in a mesh shape such that a plurality of polygonal opening portions is arranged on the wiring portion,
wherein the plurality of thin metal lines of at least one wiring portion of the two wiring portions forms an irregular wiring pattern which is made to be irregular by making the plurality of opening portions have different opening shapes,
wherein in the display unit, pixels, which include a plurality of sub-pixels emitting light with a plurality of colors that are at least three colors different from each other, are arranged in pixel array patterns,
wherein the conductive film is provided on the display unit such that a combined wiring pattern of the two wiring portions including at least one irregular wiring pattern overlaps with the pixel array pattern of the display unit, and
wherein from at least one point of view, the irregular wiring pattern is a polygonal wiring pattern formed such that an indicator of evaluation of noises is equal to or less than an evaluation threshold value, where in frequencies and intensities of the noises of respective colors of a plurality of colors calculated from a first peak frequency and a first peak intensity of a plurality of first spectrum peaks of two-dimensional Fourier spectra of transmittance image data of the combined wiring pattern and a second peak frequency and a second peak intensity of a plurality of second spectrum peaks of two-dimensional Fourier spectra of luminance image data of the pixel array patterns of the respective colors when light beams with the plurality of colors are respectively emitted, the indicator of evaluation is calculated from evaluation values of the noises of the respective colors obtained by applying human visual response characteristics in accordance with an observation distance to intensities of the noises equal to or greater than a first intensity threshold value among intensities of the noises at frequencies of the noises equal to or less than a frequency threshold value defined on the basis of a display resolution of the display unit.

2. The conductive film according to claim 1, wherein the opening portions have two or more types of different opening shapes and polygonal shapes having two or more types of different numbers of vertices of the opening shapes.

3. The conductive film according to claim 2, wherein each opening portion is formed in a Voronoi polygonal shape or a Delaunay triangular shape based on seed points randomly arranged on a single planar region.

4. The conductive film according to claim 1,
wherein the irregular wiring pattern of the thin metal lines is a wiring pattern of thin lines formed of random line segments that are obtained by performing thinning processing on boundary regions between polygonal images which are obtained by patterning polygons of which centroids are seed points randomly arranged in a single planar region, and
wherein shapes of the opening portions are deformed by performing the thinning processing on the polygons of the polygonal images, and includes two or more different opening shapes surrounded by the thin lines formed of the random line segments.

5. The conductive film according to claim 1, wherein the evaluation threshold value is −2.80.

6. The conductive film according to claim 1, wherein the luminance image data of the pixel array patterns of the respective colors is normalized luminance data that is obtained by normalizing the luminance image data obtained by converting captured image data of the colors, which is obtained by capturing images of the pixel array patterns of the respective colors displayed on the display screen of the display unit, into luminance values, when the light beams with the plurality of colors are separately emitted.

7. The conductive film according to claim 6, wherein images of the pixel array patterns of the respective colors displayed on the display screen of the display unit are displayed on the display unit when the light beams with the plurality of colors are separately emitted at a maximum intensity which is settable for each color.

8. The conductive film according to claim 7, wherein when the plurality of colors is three colors such as red, green, and blue, the captured image data of the images of the pixel array patterns of the respective colors such as red, green, and blue is image data that is obtained through imaging performed through white balance adjustment based on a white color of a Macbeth chart.

9. The conductive film according to claim 1,
wherein the luminance image data of the images of the pixel array patterns of the respective colors of the plurality of colors is obtained by giving the luminance data in which a measured luminance value is normalized through a product between a resolution of the display unit and an area having a value of a mask image, where the mask image is created from the captured image data which is obtained by capturing the image of the pixel array pattern of a current color displayed on the display screen of the display unit through a microscope, when the light beams of the respective colors of the plurality of colors are separately emitted in the display unit, and
wherein the luminance image data is obtained by normalizing a reference luminance of the display unit of the display device to 1.0.

10. The conductive film according to claim 9,
wherein when the plurality of colors is three colors such as red, green, and blue, the measured luminance value is a luminance value which is obtained from spectrum data of each color of red, green, and blue by separately performing display for each color of red, green, and blue and performing measurement through a spectrometer, and
wherein the mask image is an image that is obtained by binarizing the captured image data which is obtained through imaging of the microscope.

11. The conductive film according to claim 1, wherein the two wiring portions are respectively formed on both side surfaces of the transparent substrate.

12. The conductive film according to claim 1, further comprising a second transparent substrate that is different from a first transparent substrate when the transparent substrate is defined as the first transparent substrate,
wherein one wiring portion of the two wiring portions is formed on one surface of the first transparent substrate, and
wherein the other wiring portion of the two wiring portions is formed on one surface of the second transparent substrate, on the other surface side of the first transparent substrate.

13. The conductive film according to claim 1, wherein the two wiring portions are respectively formed with insulation layers interposed therebetween on single sides of the transparent substrates.

14. The conductive film according to claim 1, wherein all the plurality of thin metal lines of the two wiring portions constitutes the irregular wiring pattern.

15. The conductive film according to claim 1,
wherein the plurality of thin metal lines of one wiring portion of the two wiring portions constitutes the irregular wiring pattern, and
wherein the plurality of thin metal lines of the other wiring portion constitutes a regular polygonal wiring pattern.

16. The conductive film according to claim 1,
wherein the plurality of thin metal lines of one wiring portion of the two wiring portions constitutes the irregular wiring pattern,
wherein the other wiring portion is made of indium tin oxide, and
wherein the combined wiring pattern is the irregular wiring pattern.

17. The conductive film according to claim 1,
wherein at least one wiring portion of the two wiring portions includes an electrode portion and a non-electrode portion,
wherein the plurality of thin metal lines of one of the electrode portion and the non-electrode portion constitutes the irregular wiring pattern, and
wherein the plurality of thin metal lines of the other of the electrode portion and the non-electrode portion constitutes a regular polygonal wiring pattern.

18. The conductive film according to claim 1,
wherein the plurality of first spectrum peaks has a peak intensity that is equal to or greater than a first threshold value which is selected from a plurality of spectrum peaks obtained by performing two-dimensional Fourier transform on the transmittance image data of the combined wiring pattern, and
wherein for each of the plurality of colors, the plurality of second spectrum peaks has a peak intensity that is equal to or greater than a second threshold value which is selected from a plurality of spectrum peaks obtained by performing two-dimensional Fourier transform on the luminance image data of the pixel array pattern.

19. The conductive film according to claim 1, wherein a frequency and an intensity of a noise corresponding to each color can be calculated through convolution operation of the first peak frequency and the first peak intensity and the second peak frequency and the second peak intensity corresponding to each color.

20. The conductive film according to claim 1,
wherein a frequency of a noise corresponding to each color is given as a difference between the first peak frequency and the second peak frequency corresponding to each color, and
wherein an intensity of the noise corresponding to each color is given as a product between the first peak intensity and the second peak intensity corresponding to each color.

21. The conductive film according to claim 1, wherein an evaluation value of the noise is calculated by weighting a visual transfer function, which corresponds to the observation distance as the visual response characteristics, to the frequency and the intensity of the noise through convolution integration.

22. The conductive film according to claim 21, wherein the visual transfer function VTF is given by the following Expression (1), $$\text{VTF}=5.05e^{-0.138k}(1-e^{0.1k}) \quad (1), \text{ and}$$

$$k=\pi du/180$$

where k is a spatial frequency (cycle/deg) defined by a solid angle, u shown in the above-mentioned Expression (1) is a spatial frequency (cycle/mm) defined by a length, and d is defined by an observation distance (mm).

23. The conductive film according to claim 1, wherein the indicator of evaluation of the noises is calculated using a largest evaluation value among the evaluation values of the plurality of the noises in which a frequency of one of the noises is weighted in accordance with the observation distance for each color.

24. The conductive film according to claim 23, wherein the indicator of evaluation of the noises is a largest sum among sums for the plurality of colors, the sums being obtained by adding the frequencies of all the noises to the largest evaluation value selected with respect to the frequency of one of the noises for each color.

25. The conductive film according to claim 1, wherein the first intensity threshold value is −4.5 as a common logarithm, and the frequency threshold value is a spatial frequency which is obtained from the resolution of the display unit.

26. The conductive film according to claim 25, wherein assuming that a display pixel pitch of the display unit is Pd μm, the spatial frequency obtained from the resolution of the display unit is a highest frequency of the noises which is given as 1000/Pd cycle/mm.

27. The conductive film according to claim 1,
wherein from at least two points of view of front observation and oblique observation, the evaluation value is obtained for each color of the plurality of colors, and
wherein the indicator of evaluation is a largest evaluation value among evaluation values of respective colors obtained in the at least two points of view.

28. The conductive film according to claim 1, wherein the pixel array patterns are black matrix patterns.

29. A display device comprising:
a display unit in which pixels, which include a plurality of sub-pixels emitting light with a plurality of colors that are different from each other, are arranged in pixel array patterns which are repeated in a certain direction and a direction perpendicular to the certain direction; and
the conductive film according to claim 1, the conductive film being provided on the display unit.

30. A method of evaluating a conductive film that is provided on a display unit of a display device and has two wiring portions which are formed on both sides or a single side of the transparent substrate, the method comprising:
providing a plurality of thin metal lines on at least one wiring portion of the two wiring portions;
causing the plurality of thin metal lines to have a polygonal wiring pattern formed in a mesh shape such that a plurality of polygonal opening portions is arranged on the wiring portion;
causing the plurality of thin metal lines of at least one wiring portion of the two wiring portions to form an irregular wiring pattern which is made to be irregular by making the plurality of opening portions have different opening shapes;
arranging pixels, which include a plurality of sub-pixels emitting light with a plurality of colors that are at least three colors different from each other, in pixel array patterns, in the display unit;
providing the conductive film on the display unit such that a combined wiring pattern of the two wiring portions including at least one irregular wiring pattern overlaps with the pixel array pattern of the display unit;
acquiring transmittance image data of the combined wiring pattern and luminance image data of the pixel array patterns of respective colors of the plurality of colors of the display unit when light beams with the plurality of colors are respectively emitted, from at least one point of view;
calculating a first peak frequency and a first peak intensity of a plurality of first spectrum peaks of two-dimensional Fourier spectra of transmittance image data of the combined wiring pattern and a second peak frequency and a second peak intensity of a plurality of second spectrum peaks of two-dimensional Fourier spectra of luminance image data of the pixel array patterns of the respective colors of the plurality of colors, for each color, by performing two-dimensional Fourier transform on the transmittance image data of the combined wiring pattern and the luminance image data of the pixel array pattern;
calculating frequencies and intensities of noises of the respective colors of the plurality of colors from the first peak frequency and the first peak intensity of the combined wiring pattern and the second peak frequency and the second peak intensity of the pixel array patterns of the respective plurality of colors calculated in the above-mentioned manner;
selecting noises having frequencies equal to or less than a frequency threshold value and intensities equal to or greater than a first intensity threshold value defined on the basis of a display resolution of the display unit, among the frequencies and intensities of the noises of the respective colors calculated in the above-mentioned manner;
acquiring evaluation values of noises of the respective colors by applying human visual response characteristics in accordance with an observation distance to the intensities of noises at respective frequencies of noises of the respective colors selected in the above-mentioned manner;
calculating an indicator of evaluation of the noises from the evaluation values of the noises of the respective colors acquired in the above-mentioned manner; and
evaluating the conductive film that has a polygonal wiring pattern which allows the indicator of evaluation of the noises calculated in the above-mentioned manner to be equal to or less than a predetermined value.

* * * * *